US012670964B2

(12) United States Patent
Son et al.

(10) Patent No.: US 12,670,964 B2
(45) Date of Patent: Jun. 30, 2026

(54) APPARATUS AND METHOD FOR CHANGING A READ VOLTAGE APPLIED FOR READING DATA FROM A NON-VOLATILE MEMORY CELL

(71) Applicant: SK hynix Inc., Gyeonggi-do (KR)

(72) Inventors: Jae Yong Son, Gyeonggi-do (KR); Jeong Myung Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 161 days.

(21) Appl. No.: 18/604,519

(22) Filed: Mar. 14, 2024

(65) Prior Publication Data

US 2025/0131969 A1 Apr. 24, 2025

(30) Foreign Application Priority Data

Oct. 19, 2023 (KR) ........................ 10-2023-0140252

(51) Int. Cl.
| | |
|---|---|
| *G11C 29/42* | (2006.01) |
| *G11C 29/02* | (2006.01) |
| *G11C 29/52* | (2006.01) |

(52) U.S. Cl.
CPC ............ *G11C 29/022* (2013.01); *G11C 29/52* (2013.01)

(58) Field of Classification Search
CPC .............................. G11C 29/022; G11C 29/52
See application file for complete search history.

(56) References Cited

U.S. PATENT DOCUMENTS

| | | | |
|---|---|---|---|
| 11,610,116 B2 | 3/2023 | Zhang et al. | |
| 2021/0223974 A1* | 7/2021 | Zhang | ..................... G06F 3/061 |
| 2022/0171566 A1* | 6/2022 | Kim | ..................... G11C 16/349 |
| 2024/0168651 A1* | 5/2024 | Huang | .................. G06F 3/0679 |

FOREIGN PATENT DOCUMENTS

WO 2022/037071 A1 2/2022

* cited by examiner

*Primary Examiner* — Min Huang
(74) *Attorney, Agent, or Firm* — IP & T GROUP LLP

(57) ABSTRACT

A read retry table generator is coupled to a plurality of memory dies via a data path. The read retry table generator is configured to: collect data from a plurality of memory cells coupled to a plurality of word lines in the plurality of memory dies; determine a pass rate of collected data appertaining to a plurality of clusters; select a cluster candidate among the plurality of clusters, based on a pass rate of collected data; and cluster the collected data into the cluster candidate to generate a read retry table.

19 Claims, 13 Drawing Sheets

FIG. 3

| RRT | R1 | R6 | R8 | R11 |
|-----|-----|-----|------|------|
| 1 | 60 | 20 | -20 | -90 |
| 2 | 90 | 0 | -60 | -70 |
| 3 | 60 | 0 | -30 | -50 |
| 4 | -40 | 150 | 110 | 0 |
| 5 | 80 | -30 | -70 | -90 |
| 6 | 50 | -40 | -110 | -120 |
| ... | ... | | | |
| 50 | -10 | -80 | -140 | -200 |

340

COLLECTING DATA FROM CELLS
COUPLED TO SAMPLED WORDLINES

342

SELECTING CANDIDATE CLUSTERS
BASED ON PASS RATES

344

PERFORMING FIRST CLUSTERING FOR
WORDLINES BASED ON CADIDATE CLUSTERS

346

PERFORMING SECOND
CLUSTERING FOR OUTLIER

348

GENERATING READ RETRY TABLE
CORRESPONDING CLUSTERING DATA

FIG. 6

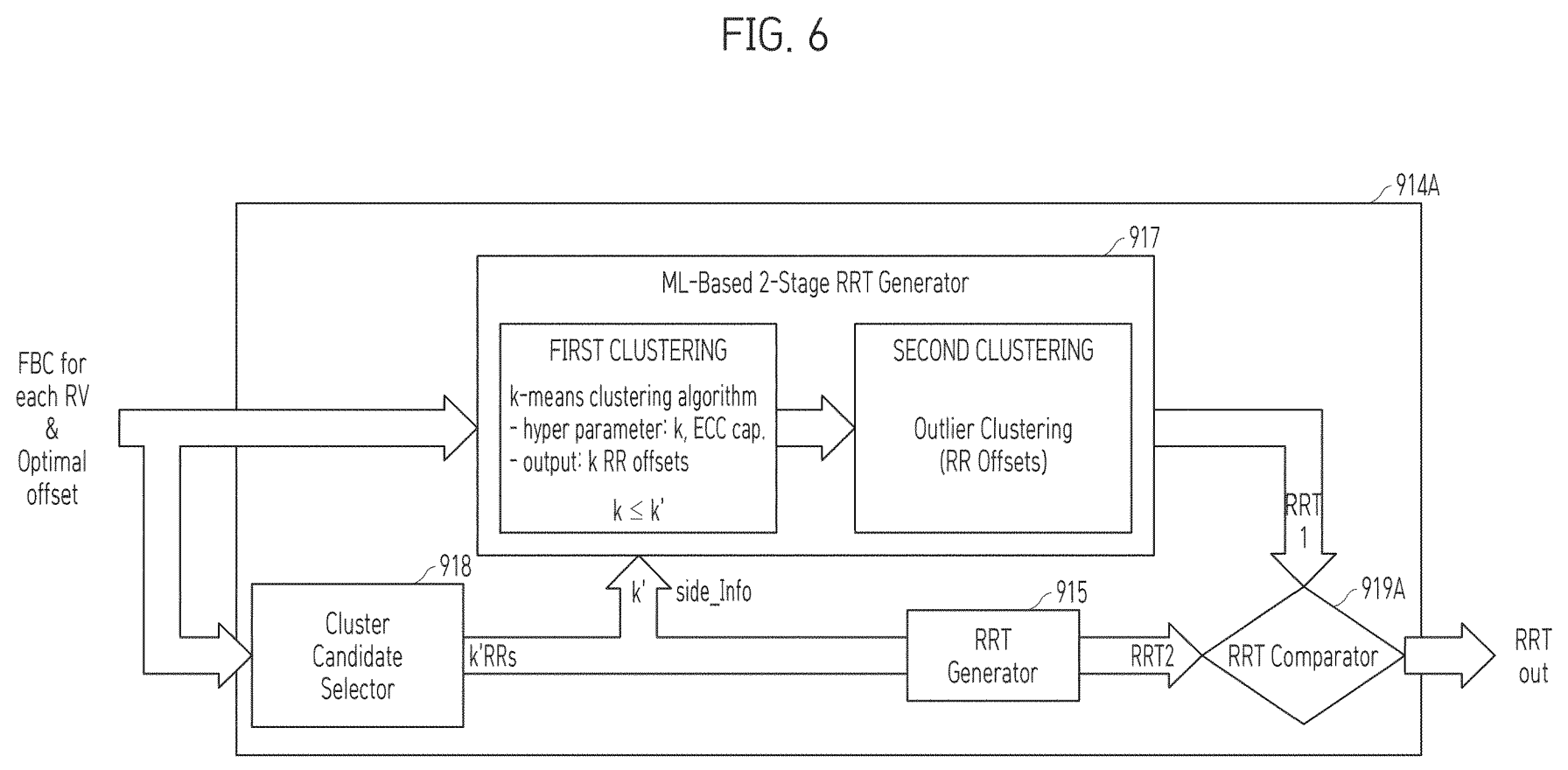

RRT out

914A

ML-Based 2-Stage RRT Generator 917

FIRST CLUSTERING k-means clustering algorithm
- hyper parameter: k, ECC cap.
- output: k RR offsets $k \le k'$

SECOND CLUSTERING

Outlier Clustering
(RR Offsets)

RRT 1

919A

RRT Comparator

RRT2

RRT Generator 915 side_Info k' k'RRs

Cluster Candidate Selector 918

FBC for each RV & Optimal offset

FIG. 8

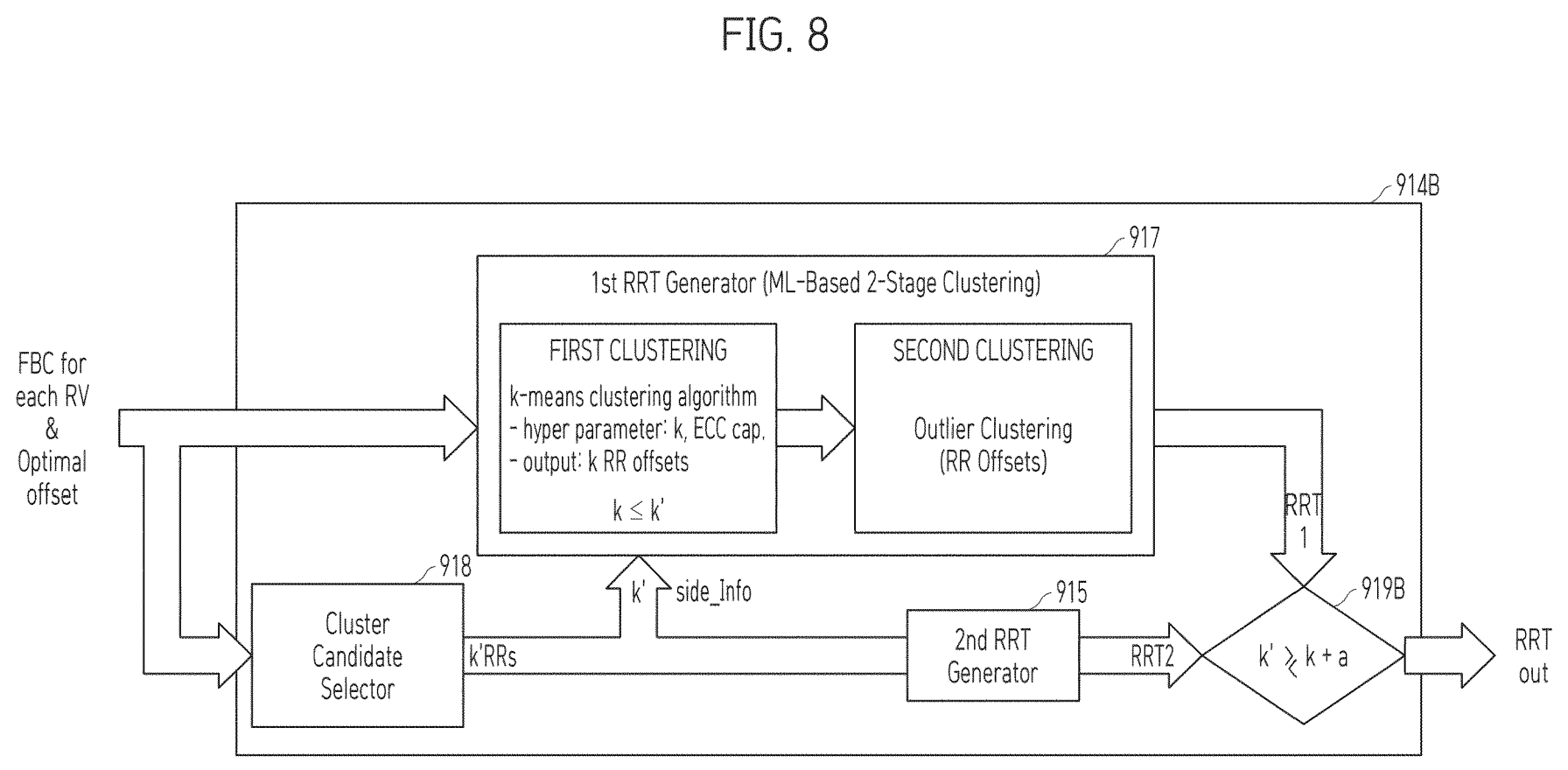

RRT
out

914B

919B

RRT
1 k' ≷ k + a

917

SECOND CLUSTERING

Outlier Clustering
(RR Offsets)

1st RRT Generator (ML-Based 2-Stage Clustering)

FIRST CLUSTERING k-means clustering algorithm
- hyper parameter: k, ECC cap.
- output: k RR offsets k ≤ k'

RRT2

915

2nd RRT
Generator k'
side_Info

918 k'RRs

Cluster
Candidate
Selector

FBC for
each RV
&
Optimal
offset

IMPROVED RRT COVERAGE

RRT COVERAGE

APPARATUS AND METHOD FOR CHANGING A READ VOLTAGE APPLIED FOR READING DATA FROM A NON-VOLATILE MEMORY CELL

CROSS-REFERENCE TO RELATED APPLICATIONS

This patent application claims the benefit of priority under 35 U.S.C. § 119 (a) to Korean Patent Application No. 10-2023-0140252, filed on Oct. 19, 2023, the entire disclosure of which is incorporated herein by reference.

TECHNICAL FIELD

One or more embodiments of the present disclosure described herein relate to a memory device, and more particularly, to an apparatus and a method for generating or changing a read voltage applied for reading data stored in non-volatile memory cells in the memory device.

BACKGROUND

Memory devices are typically provided in a computer or other electronic devices as internal, semiconductor, integrated circuit, and/or external removable devices. There are various types of memories including a volatile memory and a non-volatile memory. The volatile memory may require power to retain data stored therein. The volatile memory may include a random access memory (RAM), a dynamic random access memory (DRAM), a static random access memory (SRAM), and a synchronous dynamic random access memory (SDRAM). The non-volatile memory may retain data stored therein when power is not supplied. The non-volatile memory may include a NAND flash memory, a NOR flash memory, a Phase Change Random Access Memory (PCRAM), a Resistive Random Access Memory (RRAM), and a Magnetic Random Access Memory (MRAM). Improving memory devices may include integrated control of different types of memories, reduced power consumption, increased reliability of data retention, protection against potential modification of data due to interruption of power supply, and/or reduced manufacturing costs.

BRIEF DESCRIPTION OF THE DRAWINGS

The description herein makes reference to the accompanying drawings wherein like reference numerals refer to like parts throughout the figures.

FIG. 3 describes a read retry table according to an embodiment of the present disclosure.

FIG. 6 illustrates a first read retry table generator according to an embodiment of the present disclosure.

FIG. 8 illustrates a second read retry table generator according to another embodiment of the present disclosure.

DETAILED DESCRIPTION

Figure 1:
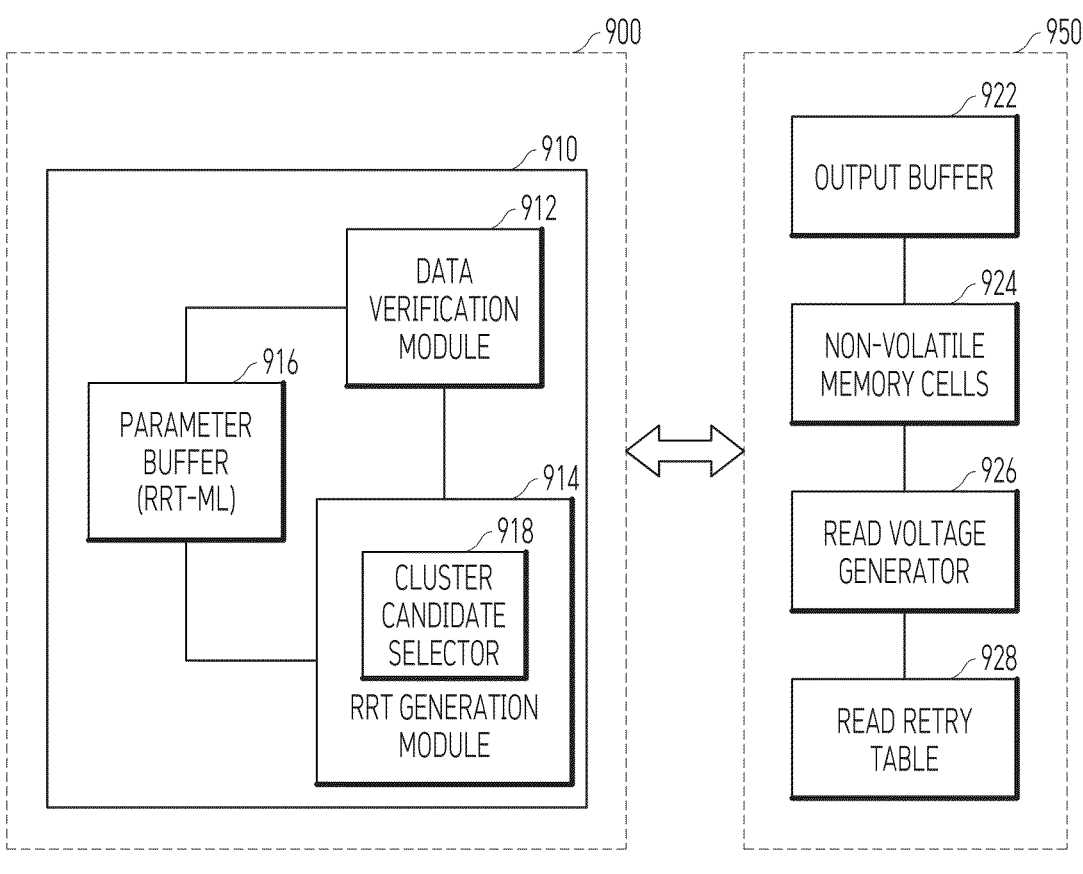
FIG. 1 describes a memory test apparatus according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in a manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory (ies) that work together to cause an apparatus, such as a mobile phone or server, to perform various functions and (c) circuits, such as a micro-processor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or a portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Embodiments of the present disclosure can provide an apparatus and method capable of generating a read retry table used for changing a level of a read voltage applied to a word line for reading data stored in a non-volatile memory cell. The apparatus can be configured to collect sampled data from a plurality of memory dies including non-volatile memory cells, select a cluster candidate based on a pass rate, perform a first clustering on a plurality of word lines into the cluster candidate based on an error correction capability of an ECC module regarding collected data, perform a second clustering on outliers after the first clustering, and generate the read retry table based on clustered word lines.

An embodiment of the present disclosure can provide an apparatus and an operation method for reducing costs and times required for development and production of a plurality of memory dies, by sampling data from a wafer on which a plurality of memory dies is formed, selecting a cluster candidate based on a pass rate, and generating a read retry table based on a machine learning mechanism using a clustering algorithm.

An embodiment of the present disclosure can provide an apparatus and method for reducing consumed resources in a procedure of generating a read retry table based on a machine learning mechanism using sampled data when modification or update of a read retry table is necessary based on an operating state, wear, or lifetime of a plurality of memory dies included in a memory system.

In an embodiment of the present disclosure, a read retry table generator can be coupled to a plurality of memory dies via a data path. The read retry table generator can be configured to: collect data from a plurality of memory cells coupled to a plurality of word lines in the plurality of memory dies; determine a pass rate of collected data appertaining to a plurality of clusters; select a cluster candidate among the plurality of clusters, based on a pass rate of collected data; and cluster the collected data into the cluster candidate to generate a read retry table.

The plurality of memory dies can be arranged in a same row or a same column of a same wafer.

The plurality of word lines can correspond to at least one same row address sampled from a memory block or a word line group included in each of the plurality of memory dies.

The read retry table generator can be coupled to the plurality of memory dies via a same channel of the data path.

The read retry table generator can be configured to cluster the collected data into the cluster candidate by performing a first clustering on the plurality of word lines based on an error correction capability of error correction circuitry for the collected data; performing a second clustering on an outlier of the first clustering; and generating or updating the read retry table based on values obtained from the first clustering and the second clustering.

The read retry table generator can include a cluster candidate selector configured to, for at least one cluster on the plurality of word lines, increase the pass rate of the at least one cluster if a fail bit count is within the error correction capability of the error correction circuitry, and sequentially select the cluster candidate starting from the highest pass rate among the pass rates for each cluster; and a first read retry table generator configured to generate a first read retry table by performing the first clustering for the cluster candidate and the second clustering for the outlier.

The first clustering can include searching a centroid corresponding to the cluster candidate; adding a word line belonging to a Voronoi distance range from the centroid into the cluster candidate, the Voronoi distance range corre-sponding to the error correction capability of the error correction circuitry; and classifying a word line which does not belong to the cluster candidate as the outlier of the first clustering.

The read retry table generator can be configured to calculate the fail bit count for each of the plurality of word lines based on preset levels of a read voltage, the preset levels corresponding to selected values among multi-bit data stored in the plurality of memory cells.

The second clustering can include adding the outlier of the first clustering to an additional cluster having a Voronoi distance range calculated based on the error correction capability of the error correction circuitry and a fail bit count which is obtained by applying values stored or predeter-mined in the read retry table before the read retry table generator generates or updates the read retry table; and calculating values for the read retry table to add all of the outlier of the first clustering to the additional cluster.

The read retry table generator can further include a second read retry table generator configured to generate a second read retry table based on information regarding the cluster candidate, through the first clustering and another clustering distinct from the second clustering; and a comparator con-figured to compare the first read retry table with the second read retry table and select one of the first read retry table and the second read retry table based on a comparison result.

The comparator can compare ranges of the first read retry table and the second read retry table and select the one with a wider range.

The comparator can compare a number of tables belong-ing to each of the first read retry table and the second read retry table and select the one with a smaller number of tables.

In another embodiment of the present disclosure, a method for operating a data processing apparatus can include collecting data from a plurality of memory cells coupled to a plurality of word lines in a plurality of memory dies via a data path; determining a pass rate of collected data appertaining to a plurality of clusters; selecting a cluster candidate among the plurality of clusters, based on a pass rate of collected data; performing a first clustering on the plurality of word lines based on the cluster candidate and an error correction capability of error correction circuitry for the collected data; performing a second clustering on an outlier of the first clustering; and generating or updating a first read retry table based on values obtained from the first clustering and the second clustering.

The generating or updating the first read retry table can include receiving the values obtained from the first clustering and the second clustering via a network; generating or updating the first read retry table based on the values; and storing the first read retry table in a non-volatile memory storage.

The selecting the cluster candidate can include setting a plurality of clusters for the plurality of word lines and calculating a pass rate for each of the plurality of clusters; and sequentially selecting the cluster candidate starting from the cluster corresponding to the highest pass rate among pass rates for the plurality of clusters.

The calculating the pass rate can include increasing a pass rate of a first cluster when a fail bit count of a first word line is within the error correction capability of the error correction circuitry if applying the first word line among the plurality of word lines to the first cluster among the plurality of clusters; and decreasing the pass rate of the first cluster when the fail bit count of the first word line exceeds the error correction capability of the error correction circuitry.

The performing the first clustering can include searching a centroid corresponding to the cluster candidate; adding a word line belong to a Voronoi distance range from the centroid into the cluster candidate, the Voronoi distance range corresponding to the error correction capability of the error correction circuitry; and classifying a word line which does not belong to the cluster candidate as the outlier of the first clustering.

The performing the second clustering can include adding the outlier of the first clustering to an additional cluster having a Voronoi distance range calculated based on the error correction capability of the error correction circuitry and a fail bit count which is obtained by applying values stored or predetermined in the read retry table before the generating or updating the first read retry table; and calculating the values for the first read retry table to add all of the outlier of the first clustering to the additional cluster.

The method can further include generating a second read retry table based on information regarding the cluster candidate, through the first clustering and another clustering distinct from the second clustering; and selecting one of the first read retry table and the second read retry table.

The selecting the one of the first read retry table and the second read retry table can include comparing a number of tables belonging to each of the first read retry table and the second read retry table or ranges of the first read retry table and the second read retry table; and selecting the one with a smaller number of tables or the one with a wider range.

These and other features and advantages of the invention will become apparent from the detailed description and the accompanying drawings of embodiments of the present disclosure. Embodiments will now be described with reference to the accompanying drawings, wherein like numbers reference like elements.

FIG. 1 describes a memory test apparatus according to an embodiment of the present disclosure.

Referring to FIG. 1, a memory device 950 can include a plurality of non-volatile memory cells 924, an output buffer 922, a read voltage generator 926, and a read retry table (RRT) 928. Herein, the memory device 950 may include at least one memory die.

A memory test device 900 is coupled to the memory device 950. The memory test device 900 can be configured to check at least one of defects and operational characteristics of the memory device 950. According to an embodiment, the memory test device 900 may include various components according to a test purpose, test performance, and the like. For convenience of description, in FIG. 1, the memory test device 900 includes RRT a generating and updating (generating/updating) device 910 configured to test a read operation performed on the memory device 950 and generate or update the RRT.

The RRT can be stored in the plurality of non-volatile memory cell 924 included in the memory device 950. A read error may occur in processes of applying a read voltage to the plurality of non-volatile memory cells 924 in the memory device 950 through a word line and reading data stored in the plurality of non-volatile memory cells 924 in the memory device 950. The memory device 950 can include or store information regarding a read retry mechanism for resolving the read error. One example of the information regarding the read retry mechanism may include the RRT. The read retry mechanism can use the RRT to record a location where the read error occurred and apply an appropriate correction value to a level of a read voltage to be applied via the word line for re-reading data stored in the plurality of non-volatile memory cells 924, to improve or ensure data integrity.

The RRT generating/updating device 910 can include a data verification module 912 configured to verify read data, a parameter buffer 916 configured to store variables, parameters, and results, of a machine learning (ML) mechanism regarding the RRT, and a RRT generation module 914 configured to perform a machine learning (ML) mechanism to determine values included in the RRT. According to an embodiment, the memory test device 900 may store the RRT in the parameter buffer 916 or an internal storage space.

An example of a machine learning (ML) algorithm performed by the RRT generating/updating device 910 may include a clustering algorithm. Here, clustering is an unsupervised learning method, which is a technique of grouping similar data. The clustering may be similar to a classification algorithm in terms of classifying data. The difference therebetween is that the classification algorithm is supervised learning, while the clustering is an unsupervised learning method. For example, a lot of data can be clustered based on one criterion of the two algorithms. The purpose of clustering is to separate the given data into different groups, and the observations within each group can be quite similar. Clustering can be used as one of data mining techniques. Since the clustering is an unsupervised learning method, prior knowledge about data clustering is not required. Clustering can also be applied to process large amounts of data. Examples of clustering algorithms include K-Means Clustering, Mean Shift, Gaussian Mixture Model, Density-based spatial clustering of applications with noise (DBSCAN), and Agglomerative Clustering.

According to an embodiment, the RRT generating/updating device 910 may include a cluster candidate selector 918. When the RRT generating/updating device 910 calculates values for the read retry table (RRT) that can maximize a coverage of clusters or reduce the number of clusters through the clustering, the updated read retry table (RRT) can be optimized in terms of read latency or read delay. However, because the clustering is a type of unsupervised learning method, it may be difficult to check or determine whether the read retry table (RRT) updated through the clustering has been optimized.

The cluster candidate selector 918 can select a cluster candidate or a cluster candidate group based on a pass rate obtained from data collected from the memory device 950. For example, the cluster candidate selector 918 can calculate the number of error bits (e.g., a fail bit count, FBC) of each word line in the cluster based on data obtained from the memory device 950. If the fail bit count (FBC) is within an error correction capability of error correction circuitry or an error correction code (ECC) module, the cluster candidate selector 918 can increase a pass rate of the corresponding cluster. Conversely, if the fail bit count (FBC) exceeds the error correction capability of the error correction circuitry or the ECC module, the cluster candidate selector 918 may decrease the pass rate of the corresponding cluster. The cluster candidate selector 918 may sequentially select a cluster candidate starting from the highest pass rate among the pass rates for each of a plurality of clusters. In an embodiment, the pass rate could show how many word lines or which ratio of word lines have a fail bit count (FBC) within the error correction capability of the ECC module when the word lines belong to a specific cluster. The RRT generating/updating device 910 can perform clustering starting from clusters with a larger range based on information about cluster candidates. Based on this scheme, the RRT generating/updating device 910 calculates a read retry table (RRT) that can maximize the coverage of clusters or reduce the number of clusters through the clustering.

According to an embodiment, the RRT generating/updating device 910 including the cluster candidate selector 918 can perform operations for generating different classifiers and combining predictions to derive more accurate predictions (e.g., Ensemble Learning). The operation of the RRT generating/updating device 910 including the cluster candidate selector 918 will be described later with reference to FIGS. 5 to 7.

As a result of aggressive process scaling and Multi-Level Cell (MLC) technology, a storage capacity of NAND flash memory which is one of the non-volatile memory devices, can be increased by more than tens to thousands of times. This continued increase in the storage capacity can make a non-volatile memory device economically viable for applications ranging from a consumer electronic to a data storage system. However, as a density of the non-volatile memory device increases, a non-volatile memory cell may be more exposed to noises occurring in various device and circuit levels, so that reliability and durability of the non-volatile memory cell might gradually deteriorate. For example, program and erase (P/E) cycle endurance of a multi-level cell in the NAND flash memory has dropped, for example, to up to 10k for a 5× nm flash memory or up to 3k for a 2× nm flash memory. Reliability and durability of the non-volatile memory device could be expected to continuously decrease, as the number of bits of data stored per memory cell increases and a size of the memory cell decreases. Due to this trend, when the non-volatile memory device or a memory system including the non-volatile memory device is designed, it may be preferred to apply a much stronger error correction code (ECC) to a controller or a module, in order to withstand an increasing error rate of the non-volatile memory device.

In a NAND flash memory, a logic value stored in a memory cell could be determined by a threshold voltage window or a threshold voltage distribution to which a threshold voltage of the memory cell belongs. As a size of the memory cell shrinks and more bits of data are stored per memory cell, a width of the threshold voltage window representing each logic value would become smaller, increasing the error rate when determining the logic value stored in the memory cell. This is because process variations become more widespread when an amount of charge stored in the memory cell decreases with feature size (e.g., either a minimum distance between a source and a drain of a MOS transistor or half the distance between memory cells), resulting in a large difference in threshold voltages of different memory cells storing a same logic value. As a result, it becomes increasingly difficult to determine to which logic value the threshold voltage of the memory cell corresponds.

According to an embodiment, a BCH code is one of the most commonly used ECC mechanisms in a memory system. The BCH code can perform a hard decision on which a logic value a threshold voltage corresponds to. That is, the BCH code is a hard decoding error code. A hard decision could limit a scalability of ECC codes, such as the BCH code, if an amount of charges stored in each memory cell is reduced to a smaller feature size, resulting in a narrow threshold voltage window representing the logic value stored in the memory cell. The error correction capability of the BCH code might decrease to withstand a raw bit error rate of the memory cell, which can increase exponentially with the number of program/erase (P/E) cycles.

To solve this issue, a soft decision decoding code that represents the logic value stored in the memory cell as a probability distribution can be used as a much more powerful ECC mechanism. For example, a low density parity check (LDPC) code can be used in a memory system and can reach error correction capabilities that approach the Shannon-limit. The LDPC and other similar soft decoding codes can provide much stronger corrections if there is a significant noise (variation) in a signal (threshold voltage) used to represent logic values present in other memory cells. To develop such a strong ECC, characterization and modeling of threshold voltage distributions across the plurality of non-volatile memory cells 924 in the memory device 950 may be performed by the memory test device 900. Additionally, such characterization or modeling may enable other potential improvements in reliability and longevity of the memory device 950. An ECC module that performs an ECC mechanism and ECC performance (e.g., error correction capability) will be described later with reference to FIGS. 9 to 12.

The memory test device 900 may use a read retry function of the memory device 950 to accurately identify a threshold voltage related to a logic value stored in a memory cell. The memory test device 900 may determine a threshold voltage distribution model by using a statistical technique using a large number of threshold voltage measurements and a machine learning mechanism to analyze observed threshold voltages. Further, the memory test device 900 may estimate a change in threshold voltage distributions according to an increase in a program/erase (P/E) cycle of the memory device 950.

Figure 2:
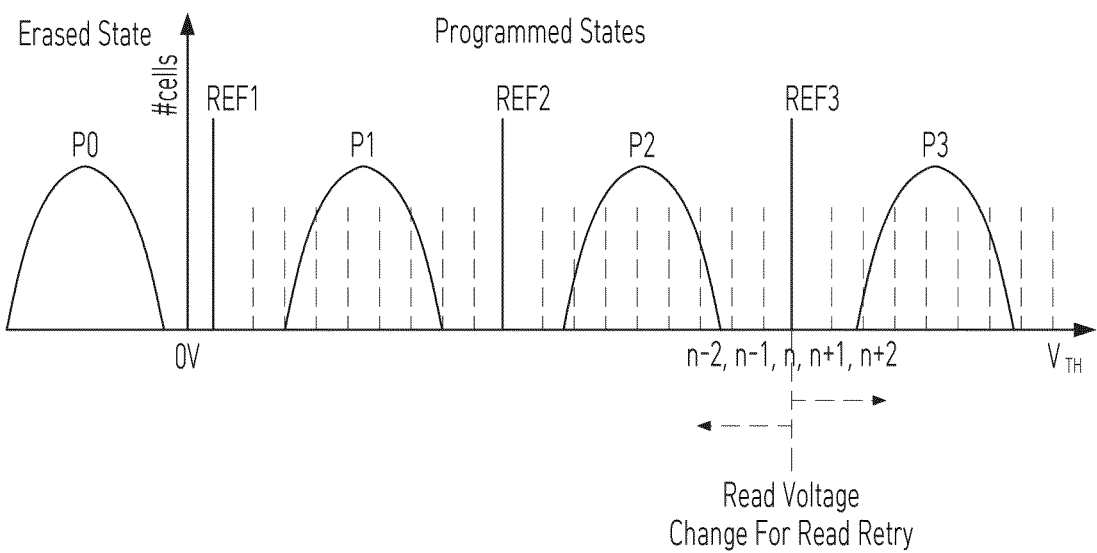
FIG. 2 describes a read retry operation according to embodiments of the present disclosure.

FIG. 2 describes a read retry operation according to embodiments of the present disclosure. Specifically, FIG. 2 describes a program state of a non-volatile memory cell storing 2-bit data, a level of a read voltage for reading programmed data, and a change in the level of the read voltage according to a read retry operation.

Referring to FIG. 2, the non-volatile memory cell can have an erased state P0 and three programmed states P1 to P3. For example, the memory device 950 can apply a second reference voltage REF2 to the non-volatile memory cell to distinguish the erase state P0 and the first programmed state P1 from the second and third program states P2, P3. In the memory device 950, a first reference voltage REF1 can be used to distinguish the erased state P0 from the first programmed state P1. The memory device 950 may use a third reference voltage REF3 to distinguish the second and third programmed states P2, P3 from each other. For example, the eras state P0 can represent 2-bit data of '11', the first programmed state P1 can represent 2-bit data of '10', the second programmed state P2 can be represent 2-bit data of '00', and the third programmed state P3 can be represent 2-bit data of '01.' According to an embodiment, the number of bits of data that can be stored in the non-volatile memory cell may vary. Further, a quantity of reference voltages (or reference voltage levels) for discriminating multi-bit data may vary.

A plurality of program pulses may be applied in a process of programming the non-volatile memory cell from the erase state P0 to one of the first to third programmed states P1 to P3. When a program pulse is applied to a specific memory cell, a threshold voltage of the corresponding memory cell can be gradually increased. For example, non-volatile memory cells may have a threshold voltage corresponding to an erase state P0 before any data is stored or programmed. Threshold voltage distributions of the non-volatile memory cells may be changed from the erased state P0 to a first programmed state P1, from the first programmed state P1 to a second programmed state P2, and from the second programmed state P2 to a third programmed state (P3), while programming pulses are applied.

After data is stored in a non-volatile memory cell, a threshold voltage of the non-volatile memory cell may belong to one of threshold voltage distributions corresponding to the erased state P0 and the first to third programmed states P1 to P3. For example, when the memory device applies a third reference voltage REF3 to a non-volatile memory belonging to the threshold voltage distribution corresponding to the third programmed state P3, data corresponding to the threshold voltage of the corresponding non-volatile memory cell, that is, data corresponding to the third programmed state P3, could be read.

Referring to FIG. 2, memory cells programmed with a same n-bit value could belong to a same threshold voltage window (distribution) of threshold voltages, even though having different threshold voltages. Non-overlapping spaces between two threshold voltage distributions or windows could be understood as a distribution margin. For n-bit MLC NAND flash memory, $2^{(n-1)}$ preset read reference voltages (i.e., $2^{(n-1)}$ number of read voltage levels to be applied to a memory cell via a word line) are used to distinguish the $2^n$ memory cell states from each other. These read reference voltages (e.g., REF1, REF2, REF3) can be in the non-overlapping spaces (e.g., distribution margins) between the two threshold voltage distributions. Each threshold voltage distribution can be determined when upper and lower readout reference voltages are applied. During a read operation, a memory cell's threshold voltage can be repeatedly compared to preset read reference voltages until the upper and lower read reference voltages are identified to determine the stored n-bit value. Alternatively, when a specific bit among the n-bit value is read from a memory cell during a read operation, the memory cell's reference voltage could be compared with a single preset read reference voltage, according to an embodiment. When threshold voltages of memory cells belong to the threshold voltage distributions or windows corresponding to the erase state P0 and the first to third programmed states P1 to P3 described in FIG. 2, 2-bit data stored in each memory cell can be determined by the three read reference voltages (e.g., REF1, REF2, REF3). However, if a threshold voltage distribution is distorted (e.g., due to P/E cycling, loss of charge over time, or program interference or disturb due to programming of neighboring memory cells), the threshold voltage distribution could shift, or a threshold voltage distribution tail (e.g., at least one end of the threshold voltage distribution) could cross an adjacent read reference voltage level (e.g., reducing or removing the non-overlapping space between the threshold voltage distributions). In this case, if the read reference voltage level is not changed, a memory cell storing a specific logic value may be misread as one storing another logic value. To avoid or prevent such an error, a change in the threshold voltage distributions could be checked or tracked by dynamically adjusting the read reference voltage level through a read retry operation. According to an embodiment, information for the read retry operation such as a RRT may be stored in a form of a look-up table.

FIG. 3 describes a read retry table (RRT) according to an embodiment of the present disclosure. According to an embodiment, the RRT can include one or more tables, each table designed for each of operating states or conditions of the memory device 950.

Referring to FIG. 3, the RRT can include changes in a plurality of read reference voltages (e.g., R1, R6, R8, R11) corresponding to a plurality of data which could be stored in a non-volatile memory cell according to the number of read retry operations (RRT 1 to RRT 50) for the non-volatile memory cell. According to an embodiment, the change in the plurality of read reference voltages (e.g., R1, R6, R8, R11) may be set as an increase or decrease rate (e.g., %) or an increase or decrease amount (e.g., a specific numerical value).

Referring to FIG. 3, the change in read reference voltage according to the RRT might not be proportional or inversely proportional (e.g., direction or gradual movement to the right or left of the threshold voltage reference in FIG. 2) according to the number of read retry operations (RRT 1 to RRT 50). When data stored in a same memory cell is repeatedly read, repetitive read operations may cause noise or disturb, such as interference, in the memory cell or neighboring memory cells. Changes in the plurality of read reference voltages R1, R6, R8, and R11 in the RRT may be set to reduce such an adverse effect.

Figure 4:
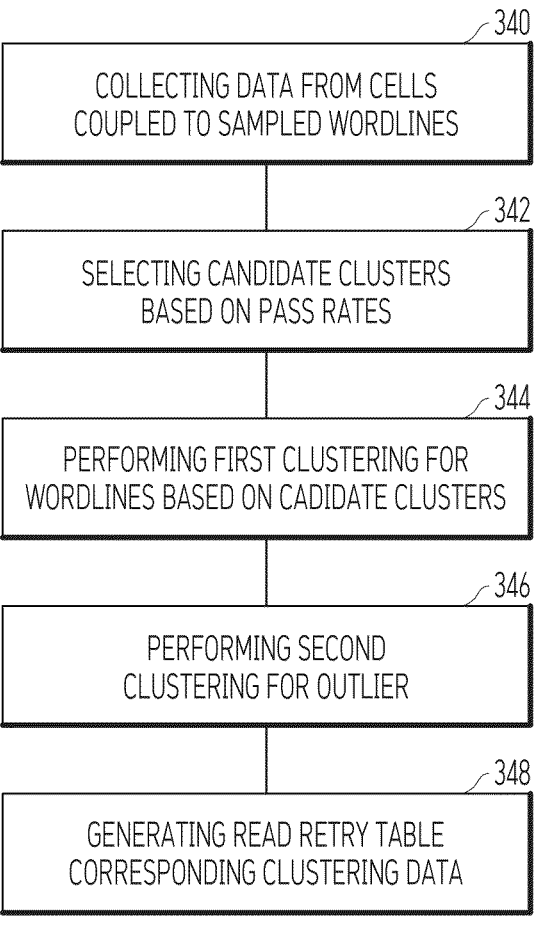
FIG. 4 illustrates a first method for generating a read retry table according to an embodiment of the present disclosure.
Figure 5:
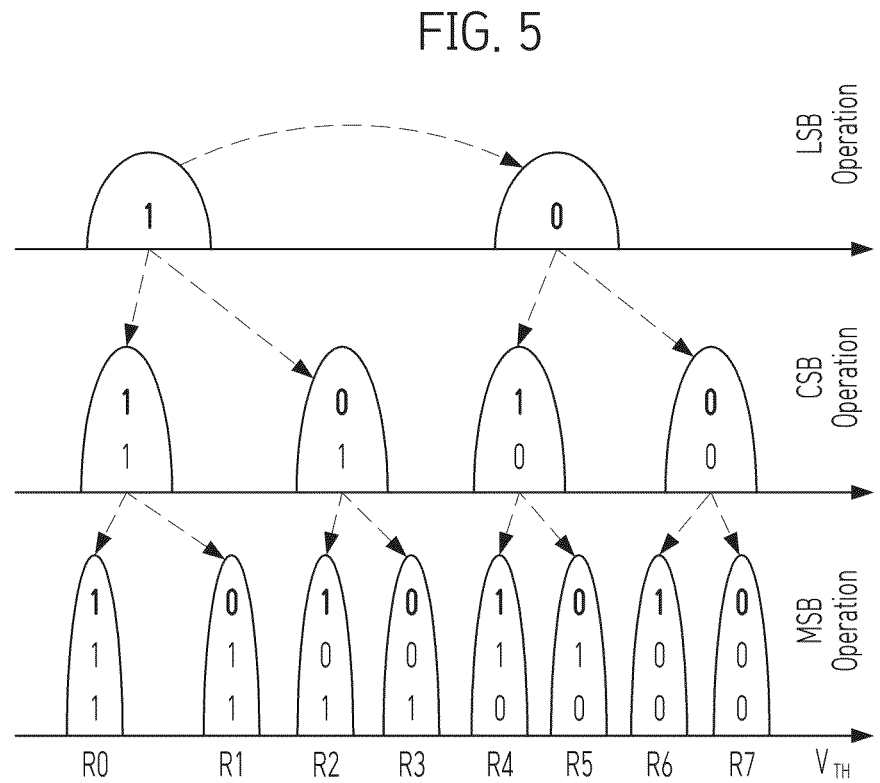
FIG. 5 illustrates a parameter used in a machine learning algorithm used for generating a read retry table according to an embodiment of the present disclosure.
Figure 5:
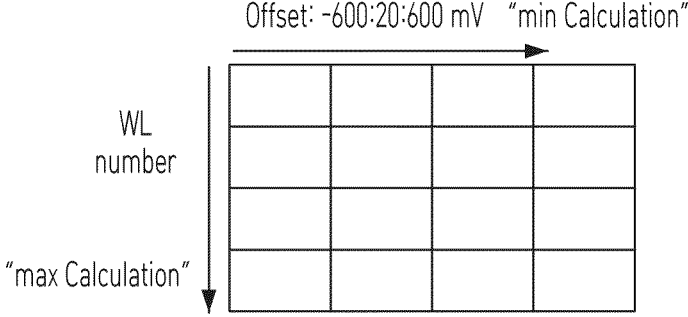

FIG. 4 illustrates a first method for generating a read retry table according to an embodiment of the present disclosure. FIG. 5 illustrates a parameter used in a machine learning algorithm used for generating a read retry table according to an embodiment of the present disclosure.

Referring to FIG. 4, the first method of generating the RRT can include collecting data from selected word lines (operation 340), selecting a cluster candidate based on a pass rate obtained from the collected data (operation 342), clustering the selected word lines based on the cluster candidate (operation 344), clustering outliers (operation 346), and generating the RRT corresponding to clustered data (operation 348). Here, the operation 344 of clustering the selected word lines based on the cluster candidate and the collected data will be described as a first clustering, and the operation 346 of clustering the outliers will be described as a second clustering.

Referring to FIG. 5, an example in which 3-bit data of a least significant bit (LSB), a center significant bit (CSB), and a most significant bit (MSB) are stored in each memory cell is described. A method of storing 3-bit data in a memory cell may be variously modified, and an embodiment of the present disclosure may not be limited to a method of programming 3-bit data. Each memory cell may have one of eight states RV0 to RV7 corresponding to 3-bit data. Here, the eight states RV0 to RV7 can indicate threshold voltage windows or threshold voltage distributions corresponding to each 3-bit data.

Referring to FIGS. 1 to 5, a logic value stored in the non-volatile memory cells 924 in the memory device 950 can be determined based on the threshold voltage window or threshold voltage distribution, which a threshold voltage of the memory cell belongs to. However, it might be inefficient to program all data in all memory cells in the memory device 950 and then read corresponding data to obtain a threshold voltage window or a threshold voltage distribution to which threshold voltages of the memory cells belong. The RRT generating/updating device 910 can select some word lines, not all word lines, and apply a read reference voltage (i.e., default level) that does not reflect the RRT for some selected word lines and another read reference voltage having a constant reference change amount (e.g., offset, 20 mV from −600 mV to +600 mV) from the read reference voltage (i.e., default level). The RRT generating/updating device 910 can estimate a fail bit count (FBC) based on each of different read reference voltages (see FIGS. 2 and 5).

Referring to FIGS. 4 and 5, the RRT generating/updating device 910 for generating or updating a RRT may use an adaptive machine learning algorithm. For a test running the adaptive machine learning algorithm, the RRT generating/updating device 910 may initialize variables and parameters. For example, a first parameter relates to the number of iterations of the adaptive machine learning algorithm. A second parameter relates to a set of initial K values to be tested by K-Means clustering, where K is a positive integer. When the first parameter is 5, the second parameter may be set to a set of $\{1, 3, 5, 7, 9\}$. A third parameter may be a value obtained by subtracting the number of error bits (fail bit count, FBC) from the error correction capability of the ECC module. For example, the third parameter Para3_LSB for a least significant bit (LSB) page when 3-bit data is stored per memory cell may be determined as following equation.

$$\text{Para3\_LSB} = (\text{ECC hard decision correction ability}) - (\max\_(\min\_FBC\_RV3 + \min\_FBC\_RV7))$$

Here, the third parameter Para3_LSB for the least significant bit (LSB) page may be determined based on the number of error bits (FBC) of two states RV3, RV7 in which CSB and MSB pages are the same and only the LSB pages are different. The 'min' may indicate the number of possible error bits (e.g., fail bit count, FBC) obtained in response to a specific data when a default read reference voltage (default level) that does not reflect the RRT and another read reference voltage that reflects a constant standard variation (offset, see FIG. 2) are applied to a word line associated with the LSB page. The 'max' may indicate a value obtained from a sum of the 'min' values regarding the number of possible error bits (FBC) corresponding to a plurality of data obtained from the word line.

The RRT generating/updating device 910 may select or sample plural word lines included in the memory device 950 and read data through the selected or sampled word lines (operation 342). For example, preset data may be stored in the plurality of memory cells 924 connected to the selected or sampled word lines, and data output from the plurality of memory cells 924 may be collected by applying read reference voltages to the selected word lines.

According to an embodiment, the RRT generating/updating device 910 can generate additional information (side_Info, see FIG. 6) that can be applied to second parameters through the cluster candidate selector 918, and perform the clustering algorithm in response to the additional information side_Info. Herein, the additional information side_Info may include information about cluster candidates selected according to the pass rate. In a conventional clustering, which is an unsupervised learning method, the number of clusters to be clustered is not fixed, so that resources required to generate or update the read retry table (RRT) may increase. However, the cluster candidate selector 918 can generate and deliver the additional information about cluster candidates according to the pass rate, thereby reducing the resources required to determine the optimal number of clusters. The configuration and operation of the cluster candidate selector 918, which selects the cluster candidate based on the pass rate obtained from the collected data, will be described later with reference to FIGS. 6 to 8.

In the first clustering (operation 344) performed by the RRT generating/updating device 910, selected or sampled word lines may be clustered based on the read reference voltage applied thereto. In this case, a range of the cluster may correspond to the error correction capability of the ECC module interworking with the memory device 950. If plural clusters on the plurality of word lines are established until centroids of the plural clusters do not change anymore, the RRT generating/updating device 910 may find or recognize that a word line that is considered an outlier does not belong to any of the plural clusters. If there is no outlier, the second clustering (operation 346) might not be carried out.

In a general machine learning algorithm, an outlier might not be considered. However, the RRT generating/updating device 910 may establish an additional cluster for the outlier through the second clustering (operation 346). In the second clustering (operation 346), the outlier could be added to the additional cluster, while changing a read reference voltage level. The outlier would be added to the additional cluster until a centroid of the additional cluster is no longer changed. The second clustering (operation 346) would be carried out until no outlier of the second clustering occurs (i.e., all outliers of the first clustering are added to the additional cluster). Accordingly, the RRT generating/updating device 910 can check a degree to which the read reference voltage level is changed (e.g., how much the read reference voltage level is changed). After the second clustering is performed, an optimal value (e.g., RR Offsets) related to a change in the read reference voltage level may be found or calculated. Based on the optimal value, the RTT may be generated or updated (operation 348).

According to an embodiment, for performing the first clustering and the second clustering, the RRT generating/updating device 910 may use a K-Means Clustering or a K-Means++ Clustering. Here, the K-Means clustering known as one of unsupervised learning algorithms is one of mechanisms for clustering data. The K-Means clustering can divide data into K clusters, and each cluster has a centroid. For example, the RRT generating/updating device 910 may establish some of plural selected or sampled word lines as one of K centroids and then assign other word lines to neighboring ones of the K centroids. This operation could be repeatedly performed and continued until the centroid of the cluster and the assigned word lines are not changed. The K-Means Clustering may operate based on a Voronoi distance. The conventional K-Means Clustering can use a method for randomly selecting K centroids from the plural selected or sampled word lines. However, the K-Means++ clustering can use a different method for selecting K centroids far away from each other to compensate for the randomness. However, in an embodiment of the present disclosure, the cluster candidate selector 918 can generate additional information regarding at least one cluster candidate according to the pass rate, so that the RRT generating/updating device 910 can easily determine the number of clusters or which cluster to start from for performing the first clustering and the second clustering.

Voronoi calculation could be used in an assignment operation of assigning each word line to the nearest centroid during the K-Means Clustering. A Voronoi diagram is a division of a plane into regions based on the distance from a particular set of points (e.g., a centroid in this case) to the nearest point. Voronoi sets can represent boundaries between clusters. Each word line can be assigned to the cluster with the closest centroid in terms of Euclidean distance. In the K-Means clustering, this operation is repeated until convergence. Finally, the plurality of word lines may appear as K clusters.

In a conventional K-Means clustering, an outlier clustering algorithm could be used to identify an outlier and prevent the outlier from affecting a clustering result. The outlier clustering algorithm, such as the Possibilistic-Fuzzy-C-Means (PFCM) algorithm, can be intended to remove changes in characteristics of a cluster, even if the cluster includes an outlier. To identify an outlier, an outlier detection method or a method using domain knowledge on data could be used. After identifying the outlier, the outlier can be removed or processed so that the outlier does not affect the clustering result. However, if some word lines in the memory device 950 are determined to be outliers and the corresponding word lines are ignored, safety and reliability of data stored in memory cells connected to the corresponding word lines could not be guaranteed. Accordingly, in the first method of generating the RRT according to an embodiment of the present disclosure, the second clustering 346 for clustering the outlier may be carried out for data safety and reliability.

During the second clustering (operation 346), regardless of the result of the first clustering (operation 344), the RRT generating/updating device 910 can extract an outlier by comparing the error correction capability of the ECC module with a value (e.g., min FBC) for the number of error bits (fail bit count, FBC) obtained when applying, to the word line, read reference voltages determined based on the RRT. When the read reference voltages determined based on the RRT are applied to a specific word line, the number of error bits (FBC) may exceed the error correction capability of the ECC module. It means that, even if the read reference voltage is changed according to a current RRT and a changed read reference voltage is applied to the corresponding word line, errors occurred in the corresponding word line could be beyond the error correction capability of the ECC module. In this case, the corresponding word line could be extracted as the outlier. It is necessary for data safety and reliability to update the current RRT based on a value obtained from performing the second clustering on the outlier.

According to an embodiment, during the second clustering (operation 346), the RRT generating/updating device 910 can extract a word line, including an error exceeding the third parameter in the first clustering (operation 344), as the outlier. The third parameter could be obtained when a read reference voltage (default level) that does not reflect the RRT and another read reference voltage that reflects a constant standard variation (offset, see FIG. 2) are applied to a selected or sampled word line. An error exceeding the third parameter in the first clustering (operation 344) may indicate that the number of error bits (fail bit count, FBC) when the current RRT is reflected is greater than that when the current RRT is not reflected. In this case, it is necessary to update the current RRT.

As described above, when an outlier for the second clustering 346 is extracted, the RRT generating/updating device 910 adds the extracted word line to the additional cluster until there are no more outliers. A second clustering can be performed and repeated until convergence.

After the first clustering (operation 344) and the second clustering (operation 346) are completed, the RRT generating/updating device 910 may generate or update the RRT based on clustered data (operation 348). The RRT generating/updating device 910 may compare values of the newly generated or updated RRT with those of the current RRT or the constant standard variation (offset) and delete overlapping values therebetween. When an amount of the values of the newly generated or updated RRT is less than that of the previous RRT or a reference offset, the newly generated or updated RRT may be determined as a new optimal RRT. Conversely, if the amount of the values of the newly calculated RRT is greater than that of the previous RRT or the reference offset, the newly generated or updated RRT might hardly be used as the new optimal RRT.

FIG. 6 illustrates a first read retry table generator according to an embodiment of the present disclosure.

Referring to FIG. 6, a first read retry table (RRT) generating module 914A can include a cluster candidate selector 918, a first read retry table generator 917, a second read retry table generator 915, and a first read retry table comparator 919A.

Referring to FIGS. 1 and 5, the first RRT generating module 914A can receive the number of error bits (e.g., the fail bit count, FBC) for eight states RV0 to RV7 corresponding to 3 bits of data stored in each memory cell coupled to a sampled word line included in the memory device 950. A data processing apparatus (or device) such as the data verification module 912 described in FIG. 1 may process information regarding data obtained from the memory device 950, error information of the data, and an operational state of the memory device 950. For example, while a test is being performed to check operational performance of the memory die, a program/erase cycle of the memory cell included in the memory device 950 can be changed. Further, in the memory device 950, a data retention time is changed, or a stress or disturbance due to a read or program operation can be induced. The data verification module 912 may collect or classify data or information according to an operational environment of the memory die or the memory device 950.

Figure 9:
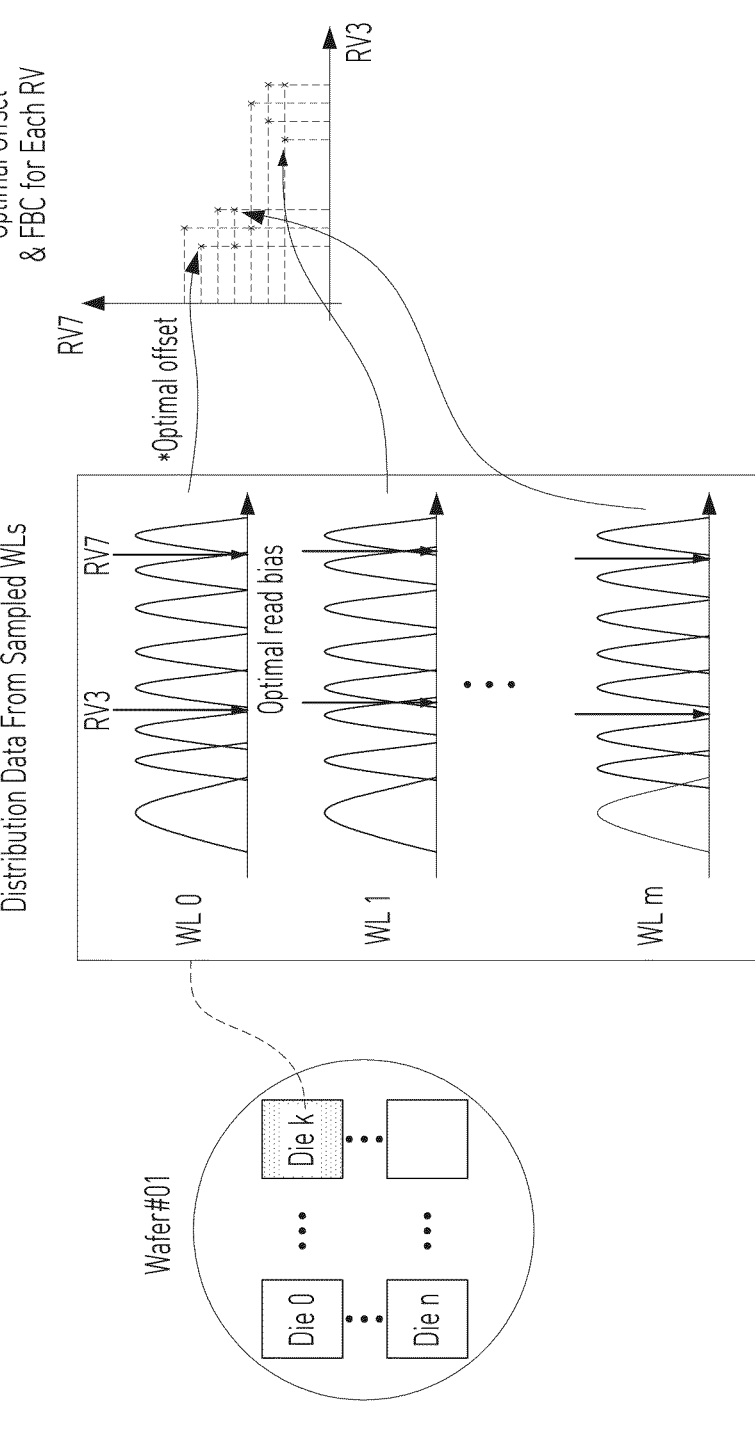
FIG. 9 illustrates a data sampling method according to an embodiment of the present disclosure.

According to an embodiment, the memory device 950 may include a plurality of memory dies (see FIG. 9). The data processing device may analyze data collected from the plurality of memory dies and calculate more comprehensive and overall operating characteristics of the plurality of memory dies based on the data collected from the plurality of memory dies. The first RRT generating module 914A can receive processed information (e.g., an optimal offset) from the data processing device. Herein, the optimal offset may include a change in the RRT (e.g., a set of read voltage levels) according to a preset interval or potential corresponding to each program state (e.g., RV0 to RV7) (see FIGS. 2 and 5). The optimal offset can be a value calculated in response to the program state (e.g., RV0 to RV7) of the memory cell included in the memory device 950. However, the optimal offset can depend on the change in the operating state or operating environment of the memory device 950. The optimal offsets corresponding to the read voltage levels for each program state (e.g., RV0 to RV7) could be different from each other.

The cluster candidate selector 918 can calculate a pass rate of the cluster based on the number of error bits (FBC) for each program state (e.g., RV0 to RV7) corresponding to data stored in the memory cell. For example, if the number of error bits (FBC) of LSB data collected through a sampled word line included in a specific memory die can be corrected with the error correction capability of the ECC module, the cluster candidate selector 918 can increase the pass rate of the cluster for the LSB data. On the other hand, if the number of error bits (FBC) of the LSB data collected through the corresponding word line exceeds the error correction capability of the ECC module, the cluster candidate selector 918 may decrease the pass rate of the cluster for the LSB data. Through this method, the cluster candidate selector 918 can calculate pass rates for the clusters corresponding to each program state (e.g., RV0 to RV7) corresponding to data stored in the memory cells.

Based on the pass rate, the cluster candidate selector 918 can select k' cluster candidates k'RRs. The k' cluster candidates k'RRs can be selected in order of a pass rate from the highest to the lowest. Herein, k' may be equal to or greater than k, which is the number of clusters in the first clustering described in FIGS. 4 and 5. k', the number of cluster candidates output by the cluster candidate selector 918, is the maximum number of clusters in the first clustering. The first clustering can be performed on k clusters that are equal to or less than k' clusters. Additional information side_Info regarding the k' cluster candidates k'RRs selected by the cluster candidate selector 918 will be input to the first read retry table generator 917 and the second read retry table generator 915.

The first read retry table generator 917 can sequentially perform the first clustering and the second clustering described in FIG. 4. The first read retry table generator 917 can perform the first clustering in response to information about k' cluster candidates k'RRs input from the cluster candidate selector 918. While performing the first clustering through the K-Means Clustering algorithm (e.g., K-Means Clustering or K-Means++ Clustering), randomness can be reduced through preferential clustering of k' cluster candidates k'RRs. That is, in a process of setting k clusters that are equal to or less than k', the first read retry table generator 917 can determine which clusters to select and how many clusters to set. Accordingly, this operation could be performed more efficiently, because the number of word lines included in the cluster candidates with a high pass rate is greater than the range of clusters selected randomly. Multiple cluster candidates having higher pass rate are likely to contain more sampled word lines than multiple clusters selected randomly. Through this operation for the first clustering, unnecessary operations could be reduced, and thus the operational efficiency of the first clustering performed by the first read retry table generator 917 can be improved.

Further, the first read retry table generator 917 may perform the second clustering on an outlier classified in the first clustering. The first read retry table generator 917 may update the read retry table (RRT) based on information calculated through the first clustering and the second clustering to generate a first read retry table RRT1.

According to an embodiment, the first RRT generating module 914A may include the second read retry table generator 915. The second read retry table generator 915 may receive additional information side_Info from the cluster candidate selector 918, like the first read retry table generator 917. The second read retry table generator 915 may generate a second read retry table RRT2 by performing a different method of clustering than the first read retry table generator 917. For example, the first read retry table generator 917 may perform the first clustering of k clusters among k' cluster candidates and the second clustering for outliers in the first clustering. On the other hand, the second read retry table generator 915 may perform a different clustering on k' cluster candidates based on the pass rate output from the cluster candidate selector 918.

According to an embodiment, the second read retry table generator 915 can select and sort a part of the previous read retry table based on a pass rate calculated by the cluster candidate selector 918. Alternatively, the second read retry table generator 915 can change or replace some of values included in the previous read retry table in response to the pass rate to generate the second read retry tableRRT2.

The first read retry table generator 917 may generate the first read retry table RRT1 based on the pass rate output from the cluster candidate selector 918, and the second read retry table generator 915 may generate the second read retry table RRT2 based on the pass rate output from the cluster candidate selector 918. Here, the first read retry table RRT1 and the second read retry table RRT2 may be different because they are output from different devices that perform different operations or clustering mechanisms. The first read retry table comparator 919A can select, determine, or output the one with a wider coverage (see FIG. 11) among the first read retry table RRT1 and the second read retry table RRT2.

Figure 7:
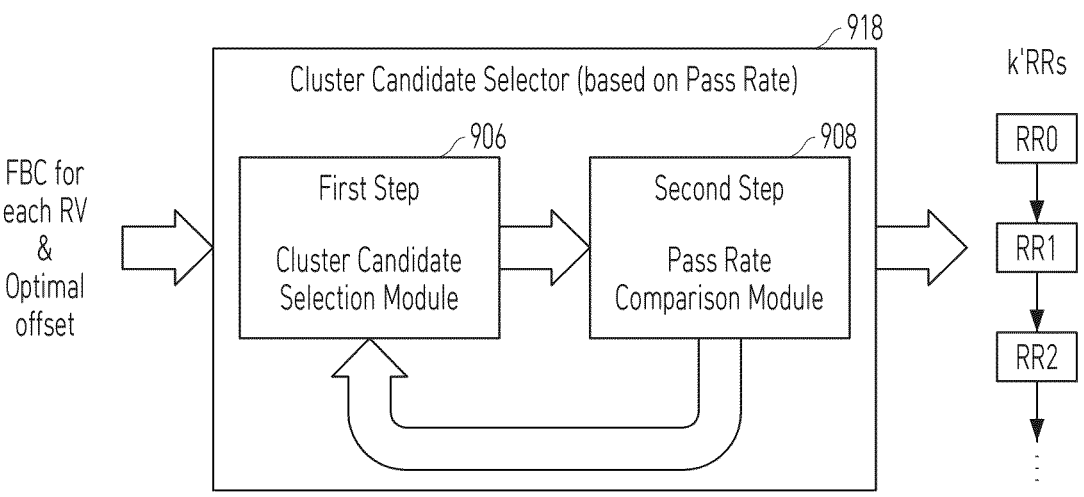
FIG. 7 illustrates a cluster candidate selector according to an embodiment of the present disclosure.

FIG. 7 illustrates a cluster candidate selector 918 according to an embodiment of the present disclosure.

Referring to FIG. 7, the cluster candidate selector 918 may include a cluster candidate selection module 906 and a pass rate comparison module 908.

The cluster candidate selection module 906 can select cluster candidates based on information input to the first read retry table generation module 914A. For example, the cluster candidate selection module 906 can receive the number of error bits (fail bit count, FBC) for 8 states (e.g., RV0 to RV7) corresponding to 3 bits of data stored by each memory cell included in the memory device 950, and/or receive processed information (e.g., optimal offsets) from the data processing device. Based on the received data and information, the cluster candidate selection module 906 may include (or add) a sampled word line corresponding to the received data into at least one among a plurality of cluster candidates. The cluster candidate selection module 906 can calculate a pass rate of a specific cluster depending on whether the sampled word line is included into the specific cluster.

The pass rate comparison module 908 may compare pass rates of the clusters calculated by the cluster candidate selection module 906 and feed-back a result according to a pass rate order (e.g., the highest to the lowest) to the cluster candidate selection module 906. Depending on the embodiment, based on the feedback information, the cluster candidate selection module 906 may first determine a cluster in which another word line will be included. Until data and the word line of the data, input to the cluster candidate selector 918, are included in at least one of the plurality of cluster candidates, the cluster candidate selection module 906 can select a new cluster in response to whether the word line is included in the plurality of cluster candidates, and calculate the pass rates for the clusters. Additionally, the pass rate comparison module 908 can repeat an operation of comparing the pass rates of each of the clusters.

In the clustering, a coverage of each cluster RR could be understood as a range of the error correction capability of the ECC module at a center of each cluster RR. Before performing clustering, the cluster candidate selector 918 may receive data. The cluster candidate selector 918 may determine whether a word line corresponding to the received data is included in a cluster based on the number of error bits corresponding to the error correction capability of the ECC module. For example, data may be output from 20 memory cells connected to a first word line. Referring back to FIG. 5, when LSB data is '1' or '0', it can be divided into two program state groups (i.e., R0 to R3 corresponding to LSB data '1' and R4 to R7 corresponding to LSB data \0'). If there are no error bits for the two program states of R3 and R4 among the data output from the 20 memory cells, the first word line connected to the 20 memory cells may be included in at least one cluster corresponding to the LSB data. If there is one error bit for the two program states of R3 and R4 among the data output from 20 memory cells, and it is determined that this error bit can be detected and corrected with the error correction capability of the ECC module, the first word line corresponds to LSB data can be included in at least one cluster.

As described above, for all word lines where data is output in response to the distribution of data obtained from the memory device 950, the number of word lines in which there is no error when applied to each cluster RR, or detection and correction are performed within the error correction capability of the ECC module, can be calculated as the pass rate or a word line pass rate (WL Pass Rate). The pass rate can be defined as the number of word lines in each cluster RR whose fail bit count (FBC) relative to the total number of word lines is within the error correction capability of the ECC module. This can be described with a formula as follows:

$$WL \text{ pass rate}_i = \frac{\# WL \text{ samples recovered by } ith \ RR}{\# \text{ total } WL \text{ samples}}$$

where 'i' is an integer to distinguish each cluster RR, and may be equal to or less than the maximum number of clusters that can be established based on the received data.

If the data received through all word lines belonging to a specific cluster has no errors or only errors within the range that can be detected and corrected by the error correction capability of the ECC module, the pass rate of the cluster can be '1' (i.e., 100%). It can be understood that the greater the pass rate of a given cluster, the greater the coverage of that cluster.

If all word lines on which data is output are included in a plurality of clusters in accordance with the distribution of data obtained from the memory device 950, the pass rates of each cluster can be compared. For example, 100 word lines may be included in all 8 clusters. The pass rate comparison module 908 can compare the pass rates of eight clusters and output cluster candidates k' RRs in order from the highest to lowest pass rate. For example, the first cluster RR0 may have the highest pass rate, the second cluster RR1 may have the second highest pass rate, and the third cluster RR2 may have the third highest pass rate.

According to an embodiment, when the pass rates for a plurality of clusters are the same, the pass rate comparison module 908 may determine cluster candidates of a higher order as the maximum fail bit count (FBC) of the corresponding cluster is lower.

The cluster candidate selector 918 can include all word lines into a plurality of cluster candidates, and then can assign priorities to the plurality of cluster candidates based on the pass rates. As described in FIG. 6, the first read retry table generator 917 may perform the first clustering in response to the cluster candidates. This can produce more efficient results than when the first read retry table generator 917 performs the first clustering based on randomness, or consume resources more efficiently even if results of the clustering are the same or similar.

When new data is received according to a change in an operating condition or an operating environment of the memory device 950, the cluster candidate selector 918 can initialize all previous cluster candidates and select or determine a new cluster candidate for the new data.

FIG. 8 illustrates a second read retry table generator 914B according to another embodiment of the present disclosure.

Referring to FIG. 8, the second read retry table (RRT) generating module 914B can include a cluster candidate selector 918, a first read retry table generator 917, and a second read retry table generator 915, and a second read retry table comparator 919B. For convenience of description, the second RRT generating module 914B described in FIG. 8 will be described focusing on differences from the first RRT generating module 914A described in FIG. 6.

Referring to FIGS. 6 and 8, the first read retry table generator 917 can generate the first read retry table RRT1 by performing the first clustering of k clusters among k' cluster candidates based on the pass rate output from the cluster candidate selector 918 and performing the second clustering for outliers of the first clustering. On the other hand, the second read retry table generator 915 can generate the second read retry table RRT2 by clustering k' cluster candidates based on the pass rate output from the cluster candidate selector 918.

Referring to FIG. 8, the second read retry table comparator 919B can compare an attribute of the first read retry table RRT1 (k+a, e.g., attributes based on k clusters and a clusters) with an attribute of the second read retry table RRT2 (e.g., attributes based on k' clusters). Here, attributes of the first and second read retry tables can include the number of tables included in each of the first and second read retry tables, the pass rates of the first and second read retry tables, or the maximum number of error bits (max FBC) based on the first and second read retry tables.

The smaller the number of tables included in a read retry table, the higher the operational efficiency of the memory device or memory system based on the read retry table. Accordingly, the second read retry table comparator 919B can select the one with a smaller number of tables, among the first read retry table RRT1 and the second read retry table RRT2.

In another embodiment, the higher the pass rate by a read retry table, the higher the operational efficiency of the memory device or memory system based on the read retry table. Accordingly, the second read retry table comparator 919B can select the one with a higher pass rate, among the first read retry table RRT1 and the second read retry table RRT2.

In another embodiment, the smaller the maximum number of error bits (max FBC) based on a read retry table, the higher the operational efficiency of the memory device or memory system based on the read retry table. Accordingly, the second read retry table comparator 919B may select the one with a smaller maximum number of error bits (max FBC), among the first read retry table RRT1 and the second read retry table RRT2.

FIG. 9 illustrates a data sampling method according to an embodiment of the present disclosure.

Referring to FIGS. 1 to 9, in order to generate or update the RRT, data is collected from the memory device 950 including the plurality of non-volatile memory cells 924. It might be critical to check operational characteristics (e.g., a threshold voltage window or a threshold voltage distribution) based on data stored in and read from the memory cells. It might be inefficient to check the threshold voltage window or threshold voltage distribution for all memory cells coupled to all word lines in the memory device 950, based on all data that can be stored in all memory cells. However, a more accurate estimation could be made as the number of selected or sampled word lines increases. Referring to FIG. 9, read reference voltages could be applied to selected or sampled word lines WL0, WL1, . . . , WLm included in a plurality of memory dies Die 0, . . . , Die k, . . . , Die n produced from a single wafer Wafer #01, to estimate threshold voltage windows or threshold voltage distributions for data stored in memory cells coupled to the selected or sampled word lines WL0, WL1, . . . , WLm. It is likely that the plurality of memory dies Die 0, . . . , Die k, . . . , Die n obtained from the same wafer Wafer #01 has similar operational characteristics. Further, it is more likely that plural memory dies Die 0 to Die k or Die 0 to Die n arranged from a same row or column in the same wafer Wafer #01 have similar operational characteristics. Also, it is more likely that a plurality of word lines or a plurality of memory blocks having same addresses or offsets in the plural memory dies Die 0 to Die k or Die 0 to Die n has similar operational characteristics.

According to an embodiment, information regarding at least one memory die Die 0, . . . , Die k, . . . , or Die n included therein may be recorded in the memory device 950. For example, the information related to at least one memory die Die 0, . . . , Die k, . . . , or Die n may include wafer information such as Wafer #01. The wafer information can include a serial number of a wafer including the corresponding memory die or a location (e.g., row or column number) of the corresponding memory die on the wafer. If the memory device 950 includes information on at least one memory die Die 0, . . . , Die k, . . . , or Die n included therein, it might be easier to generate or update a RRT having values estimated corresponding to operational characteristics.

The memory test device 900 described in FIG. 1 may perform various tests or inspections for checking errors and defects included in the plurality of memory dies Die 0, . . . , Die k, . . . , Die n obtained from the wafer Wafer #01. For several tests, the memory test device 900 can perform an operation of programming data into a plurality of memory dies Die 0, . . . , Die k, . . . , Die n or reading programmed data from the plurality of memory dies Die 0, . . . , Die k, . . . , Die n. According to an embodiment, the RRT generating/updating device 910 can utilize data collected from sampled word lines for other tests when applying read reference voltages to sampled word lines, rather than performing separate or additional operations such as data programming or reading operations for generating or updating the RRT. In addition, as described in FIG. 5, when read reference voltages (default level and a constant standard changed level, e.g., offset changed at 20 mV intervals from −600 mV to +600 mV) are applied through the sampled word lines, the number of error bits (fail bit count, FBC) can also be calculated.

A data processing device, such as the data verification module 912 described in FIG. 1, can determine or calculate an optimal offset and a fail bit count (FBC) for each program state from data received from the memory device 950. The data verification module 912 can check whether there is a word line with the same optimal offset value for each program state (e.g., R0 to R7) through data received from a plurality of memory dies (Die 0, . . . , Die k, . . . . Die n). Additionally, the data verification module 912 may check the existence of word lines having the same optimal offset value for each page (data location) in the plurality of memory dies (Die 0, . . . , Die k, . . . . Die n). According to an embodiment, the cluster candidate selector 918 can find a cluster by classifying word lines according to each program state based on the information processed in the data verification module 912. Alternatively, the cluster candidate selector 918 can find clusters by classifying word lines corresponding to each page (data location) and each program state in the plurality of memory dies (Die 0, . . . , Die k, . . . . Die n).

First, if the information transmitted from the data verification module 912 includes word lines with the same optimal offset value for each program state (e.g., R0 to R7), the cluster candidate selector 918 can have various ways to select clusters for the word lines for each program state (e.g., R0 to R7).

For example, the cluster candidate selector 918 can select a cluster based on a frequency of the optimal offset for each program state (e.g., R0 to R7). The cluster candidate selector 918 can find a plurality of optimal offset values where a frequency of word lines for each program state (e.g., R0 to R7) is the highest or above a certain threshold. The cluster candidate selector 918 can select a cluster candidate (e.g., a combination of RV3 and RV7 in the case of LSB data) from all possible combinations that can be grouped for each page.

According to an embodiment, the cluster candidate selector 918 can select a cluster based on an average or a median of the two end values of the optimal offset for each program state (e.g., R0 to R7). Herein, values at both ends of the optimal offset can indicate the minimum and maximum frequencies of the word lines. If the cluster candidate selector 918 uses the average or the median of the values at both ends of the optimal offset as a reference, the number of sampled word lines that fall within the error correction capability the ECC module centered from a position where the program state for each page is combined (e.g., RV3, RV7) can be maximum. In order to further increase the number of word lines, the coverage of the cluster can become larger when offset values are included in a preset range (see FIGS. 2 and 3) from the average or the median of the values at both ends of the optimal offset.

According to an embodiment, the cluster candidate selector 918 can select a cluster based on the number of error bits (e.g., fail bit count, FBC) for each program state (e.g., R0 to R7). The cluster candidate selector 918 can select an offset value with the smallest maximum number of error bits (max FBC) in a range between the minimum and maximum offset values for each program state (e.g., R0 to R7). Through this operation, one set can be selected for each combination of program states for each page.

When the information transmitted from the data verification module 912 includes word lines with the same optimal offset value for each page (data location) in the plurality of memory dies (Die 0, . . . , Die k, . . . . Die n), the candidate group selector 918 can use various methods to select a cluster for each page (data location) and each program state (e.g., R0 to R7) within the plurality of memory dies (Die 0, . . . , Die k, . . . . Die n). At this time, the information transmitted from the data verification module 912 may have the same or overlapping word line offsets based on data output from multiple dies or multiple planes. In this case, a plurality of word lines may overlap and be displayed as one in a two-dimensional graph based on the two program states (e.g., RV3 and RV7) described in FIG. 9.

For example, the cluster candidate selector 918 can select all sampled word lines that can be sorted by the program state as the cluster candidate. In a case when the plurality of memory dies (Die 0, . . . , Die k, . . . . Die n) is obtained from a wafer (Wafer #01) according to a same manufacturing environment and manufacturing method, offset values calculated for each page (data location) and each program state (e.g., R0 to R7) therein can be a same or fall within substantially a same range. Therefore, even if the cluster candidate selector 918 selects overlapping word lines as one cluster candidate, the number of cluster candidates may not significantly increase. In addition, in this case, the maximum cluster candidate for all sampled word lines can be selected, which increases complexity. However, the generated or updated read retry table (RRT) can be determined to have better read performance of the memory device 950 including the plurality of memory dies (Die 0, . . . , Die k, . . . . Die n).

According to an embodiment, in order to reduce complexity, the cluster candidate selector 918 can select a preset number of clusters including word lines classified by frequency-based offset combination for each page (data location) and each program state (e.g., R0 to R7). In this case, clusters can be selected in order from the highest to the lowest density of sampled word lines.

Figure 10:
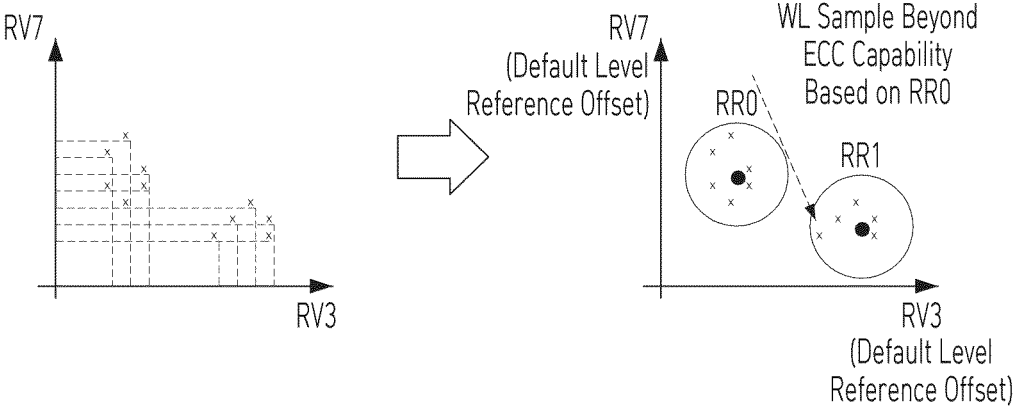
FIG. 10 illustrates a data clustering method according to an embodiment of the present disclosure.

FIG. 10 illustrates a data clustering method according to an embodiment of the present disclosure. FIG. 10 describes a specific example of the first clustering and the second clustering described in FIGS. 4, 6, and 8.

Referring to FIGS. 1 to 10, when 3-bit data is stored in the non-volatile memory cells 924, eight threshold voltage windows correspond to data stored in the plurality of non-memory cells 924 connected to each word line could be predicted. The third parameter Para3_LSB for the least significant bit (LSB) page could be obtained when a read reference voltage is applied for checking two states RV3, RV7 in which CSB page data is the same as MSB page data and LSB page data is different from CSB page data and MSB page data. Each word line can be positioned in a 2D domain of read reference voltages having a default level and other levels changed from the default level based on a constant reference variation (offset) for checking the two states RV3, RV7. The first clustering (operation 344) may be performed on selected or sampled word lines positioned in the 2D domain. A first cluster RR0 may be established through the first clustering (operation 344).

Referring to FIGS. 4 to 10, the second word line WL1 is positioned beyond the error correction capability of the ECC module based on the first cluster RR0. The second word line WL1 outside the error correction capability of the ECC module may be extracted as an outlier. A second cluster RR1 may be established by performing the second clustering (operation 346) on the second word line WL1 extracted as the outlier of the first clustering (operation 344).

When a plurality of clusters RR0, RR1 are established through the first clustering (operation 344) and the second clustering (operation 346), a ratio of sampled word lines belonging to the plurality of clusters RR0, RR1 could be calculated as the following equation.

$$ratio_i = \frac{\# \, WL \text{ samples allocated to cluster } i}{\# \text{ total } WL \text{ samples}}$$

Here, the ratio ratio; of sampled word lines in the i-th cluster (cluster i) can be calculated by dividing the number of sampled word lines (#WL samples) belonging to the i-th cluster (cluster i) by the total number of sampled word lines (#total WL samples).

Through the first clustering (operation 344) and the second clustering (operation 346), the plurality of clusters RR0, RR1 may be arranged in a descending order based on ratios of sampled word lines. For example, the first cluster RR0 may have a higher ratio of sampled word lines than the second cluster RR1. The higher the ratio of the sampled word line, the higher the weight for determining values in the RRT.

Figure 11:
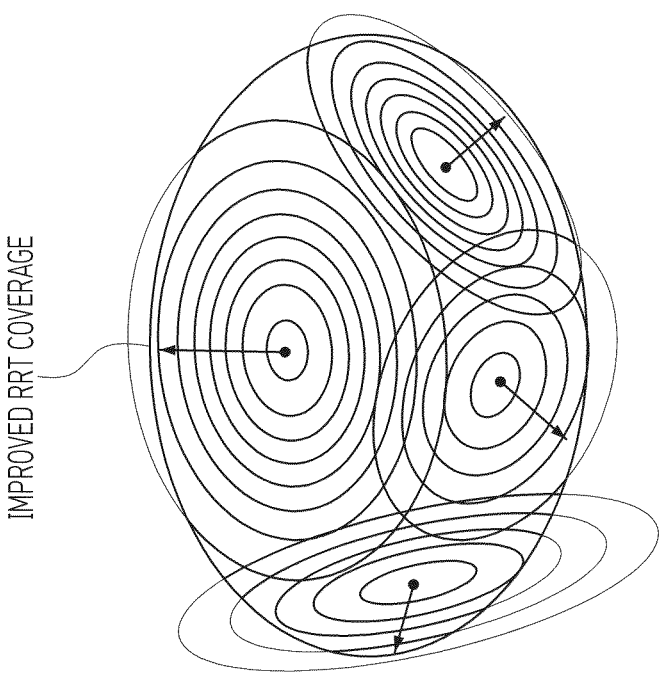
FIG. 11 illustrates coverage of a read retry table according to an embodiment of the present disclosure.
Figure 11:
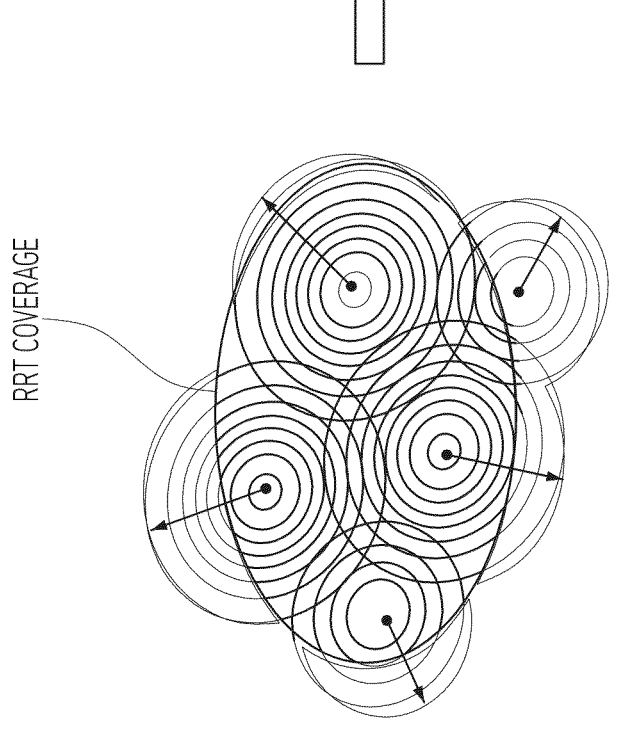

FIG. 11 illustrates a coverage of a read retry table according to an embodiment of the present disclosure. Specifically, FIG. 11 illustrates a coverage of the RRT improved according to the first method of generating or updating the RRT described in FIGS. 4 to 10. Here, coverages of two RRTs (one is made by a conventional method (i.e., RRT COVERAGE in FIG. 11) and the other is made by a method according to an embodiment of the present disclosure (i.e., IMPROVED RRT COVERAGE in FIG. 11)) may correspond to a same range of error correction capability of the ECC module used for data output in the memory system. For estimating the coverages, data could be collected from the non-volatile memory cells 924 when read reference voltages changed corresponding to the two RRTs are applied to the non-volatile memory cells.

The operational characteristics of the memory device 950 including the plurality of non-volatile memory cells 924 are not fixed and could be changed, results of the first clustering (operation 344) and the second clustering (operation 346) for generating or updating the RRT may also be different each time. By repeating clustering operations for generating or updating the RRT, values for the optimal RRT can be calculated through this repetition, so that a coverage of the RRT could be improved FIG. 12 illustrates a data processing system according to an embodiment of the present disclosure.

Figure 12:
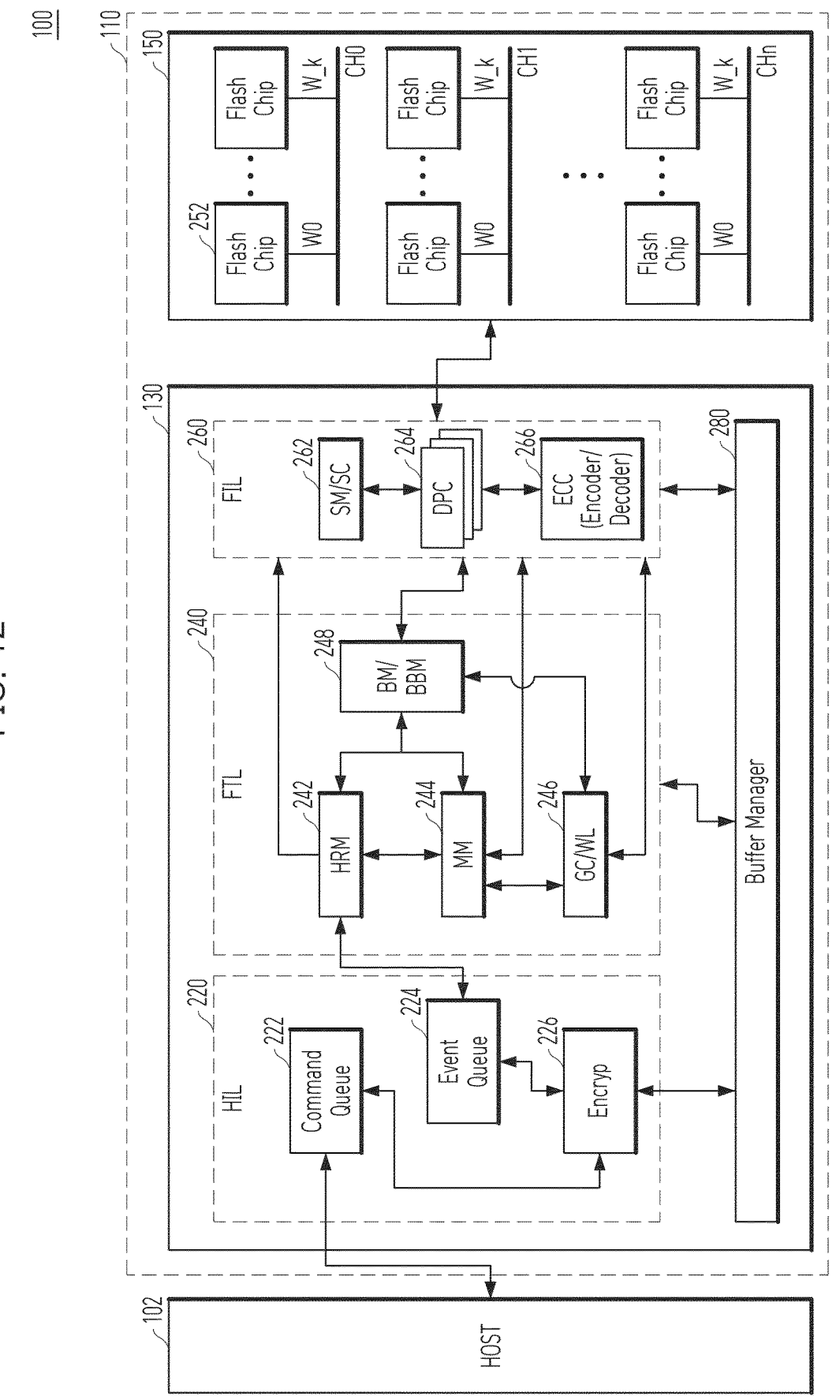
FIG. 12 illustrates a data processing system according to an embodiment of the present disclosure.

Referring to FIG. 12, the data processing system 100 may include a host 102 engaged or coupled with a memory system, such as a memory system 110. For example, the host 102 and the memory system 110 can be coupled to each other via a data bus, a host cable and the like to perform data communication.

According to an embodiment, the data processing system 100 may include the memory test device 900 described in FIG. 1. The memory test device 900 may be connected through a network to the memory system 110 or the host 102.

According to an embodiment, the RRT generating/updating device 910 described in FIG. 1 may be included in the host 102. The RRT generating/updating device 910 that performs a machine learning algorithm may require a processing device (e.g., GPU) having a fast calculation speed and a memory capable of storing data generated during calculation. The RRT generating/updating device 910 may utilize components included in the host 102.

The memory system 110 may include a memory device 150 and a controller 130. The memory device 150 and the controller 130 in the memory system 110 may be components or elements physically separated from each other. The memory device 150 and the controller 130 may be connected via at least one data path. For example, the data path may include a channel and/or a way.

The memory device 150 can include plural memory chips (e.g., flash chips) 252 coupled to the controller 130 through plural channels CH0, CH1, . . . , CHn and ways W0, . . . , W_k. The memory chip 252 can include a plurality of memory planes or a plurality of memory dies. According to an embodiment, the memory plane may be a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input and output (input/output) operations are performed in parallel or simultaneously. According to an embodiment, memory blocks included in each memory plane, or each memory die, included in the memory device 150 can be grouped to plural input/output data entries as a super memory block. An internal configuration of the memory device 150 shown in FIG. 12 may be changed based on operating performance of the memory system 110. An embodiment of the present disclosure may not be limited to the internal configuration described in FIG. 12. According to an embodiment, the memory device 150 can include the memory device 950 shown in FIG. 1. Further, according to an embodiment, the plural memory chips 252 could correspond to the plurality of memory dies Die 0, . . . , Die k, . . . . Die n obtained from the same wafer Wafer #01 shown in FIG. 6.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input/output operation (such as a read operation, a program operation, an erase operation, etc.) in response to a request or a command input from an external device such as the host 102. For example, when the controller 130 performs a read operation in response to a read request input from the external device, data stored in a plurality of non-volatile memory cells included in the memory device 150 is transferred to the controller 130. Further, the controller 130 can independently perform an operation regardless of the request or the command input from the host 102. Regarding an operation state of the memory device 150, the controller 130 can perform an operation such as garbage collection (GC), wear leveling (WL), bad block management (BBM) for checking whether a memory block is bad and handling a bad block.

The memory device 150 may include a plurality of memory blocks, each memory block including a plurality of memory cells, like the memory device 950 including the plurality of non-volatile memory cells 924 shown in FIG. 1. The memory blocks may be understood as a group of non-volatile memory cells in which data is removed together by a single erase operation. Although not illustrated, the memory block may include a page which is a group of non-volatile memory cells that store data together during a single program operation or output data together during a single read operation. For example, one memory block may include a plurality of pages. The memory device 150 may include a voltage supply circuit capable of supplying at least one voltage into the memory block. The voltage supply circuit may supply a read voltage Vrd, a program voltage Vprog, a pass voltage Vpass, or an erase voltage Vers into a non-volatile memory cell included in the memory block. The voltage supply circuit may include the read voltage generator 926 described in FIG. 1. Additionally, the voltage supply circuit may apply a read voltage Vrd to the plurality of non-volatile memory cells 924 based on the read retry table 928 described in FIG. 1 when performing a read retry mechanism. Herein, the read retry table 928 could include plural tables for each of several cases based on the read retry mechanism.

The host 102 interworking with the memory system 110, or the data processing system 100 including the memory system 110 and the host 102, is a mobility electronic device (such as a vehicle), an portable electronic device (such as a mobile phone, an MP3 player, a laptop computer, or the like), and a non-portable electronic device (such as a desktop computer, a game machine, a TV, a projector, or the like). The host 102 may provide interaction between the host 102 and a user using the data processing system 100 or the memory system 110 through at least one operating system (OS). The host 102 transmits a plurality of commands corresponding to a user's request to the memory system 110, and the memory system 110 performs data input/output operations corresponding to the plurality of commands (e.g., operations corresponding to the user's request).

Referring to FIG. 12, the controller 130 in a memory system operates along with the host 102 and the memory device 150. As illustrated, the controller 130 may have a layered structure including the host interface layer (HIL) 220, a flash translation layer (FTL) 240, and the memory interface (flash interface layer, FIL) 260.

The host interface layer (HIL) 220, the flash translation layer (FTL) 240, and the flash interface layer (FIL) 260 described in FIG. 12 are illustrated as one embodiment. The host interface layer (HIL) 220, the flash translation layer (FTL) 240, and the flash interface layer (FIL) 260 may be implemented in various forms according to the operating performance of the memory system 110.

The host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host 102 and the memory system 110 may be coupled to each other through a Universal Serial Bus (USB). The Universal Serial Bus (USB) is a highly scalable, hot-pluggable, plug-and-play serial interface that ensures cost-effective, standard connectivity to peripheral devices such as keyboards, mice, joysticks, printers, scanners, storage devices, modems, video conferencing cameras, and the like.

The memory system 110 may support the non-volatile memory express (NVMe). The non-volatile memory express (NVMe) is a type of interface based at least on a Peripheral Component Interconnect Express (PCIe) designed to increase performance and design flexibility of the host 102, servers, computing devices, and the like equipped with the memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second. According to an embodiment, the PCIe scheme may achieve bandwidths of tens to hundreds of Giga bits per second.

A buffer manager 280 in the controller 130 can control the input/output of data or operation information in conjunction with the host interface layer (HIL) 220, the flash translation layer (FTL) 240, and the flash interface layer (FIL) 260. To this end, the buffer manager 280 can set or establish various buffers, caches, or queues in the memory 144 described in the FIG. 12, and control data input/output of the buffers, the caches, or the queues, or data transmission between the buffers, the caches, or the queues in response to a request or a command generated by the host interface layer (HIL) 220, the flash translation layer (FTL) 240, and the flash interface layer (FIL) 260. For example, the controller 130 may temporarily store read data provided from the memory device 150 in response to a request from the host 102 before providing the read data to the host 102. Also, the controller 130 may temporarily store write data provided from the host 102 in a memory before storing the write data in the memory device 150. When controlling operations such as a read operation, a program operation, and an erase operation performed within the memory device 150, the read data or the write data transmitted or generated between the controller 130 and the memory device 150 in the memory system 110 could be stored and managed in a buffer, a queue, etc. established in the memory by the buffer manager 280. Besides the read data or the write data, the buffer manager 280 can store signal or information (e.g., map data, a read command, a program command, or etc. which is used for performing operations such as programming and reading data between the host 102 and the memory device 150) in the buffer, the cache, the queue, etc. established in the memory. The buffer manager 280 can set, or manage, a command queue, a program memory, a data memory, a write buffer/cache, a read buffer/cache, a data buffer/cache, a map buffer/cache, and etc.

The host interface layer (HIL) 220 may handle commands, data, and the like transmitted from the host 102. By way of example but not limitation, the host interface layer 220 may include a command queue manager 222 and an event queue manager 224. The command queue manager 222 may sequentially store the commands, the data, and the like received from the host 102 in a command queue, and output them to the event queue manager 224, for example, in order in which they are stored in the command queue manager 222. The event queue manager 224 may sequentially transmit events for processing the commands, the data, and the like received from the command queue. According to an embodiment, the event queue manager 224 may classify, manage, or adjust the commands, the data, and the like received from the command queue. Further, according to an embodiment, the host interface layer 220 can include an encryption manager 226 configured to encrypt a response or output data to be transmitted to the host 102 or to decrypt an encrypted portion in the command or data transmitted from the host 102.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or commands for reading data, i.e., a read command, and a command for programming/writing data, i.e., a write command, may be alternately transmitted to the memory system 110. The command queue manager 222 of the host interface layer 220 may sequentially store commands, data, and the like, which are transmitted from the host 102, in the command queue. Thereafter, the host interface layer 220 may estimate or predict what type of internal operations the controller 130 will perform according to the characteristics of the commands, the data, and the like, which have been transmitted from the host 102. The host interface layer 220 may determine a processing order and a priority of commands, data and the like based on their characteristics. According to the characteristics of the commands, the data, and the like transmitted from the host 102, the event queue manager 224 in the host interface layer 220 is configured to receive an event, which should be processed or handled internally within the memory system 110 or the controller 130 according to the commands, the data, and the like input from the host 102, from the buffer manager 280. Then, the event queue manager 224 can transfer the event including the commands, the data, and the like into the flash translation layer (FTL) 240.

According to an embodiment, the flash translation layer (FTL) 240 may include a host request manager (HRM) 242, a map manager (MM) 244, a state manager 246, and a block manager 248. Further, according to an embodiment, the flash translation layer (FTL) 240 may implement a multi-thread scheme to perform data input/output (I/O) operations. A multi-thread FTL may be implemented through a multi-core processor using multi-thread included in the controller 130. For example, the host request manager (HRM) 242 may manage the events transmitted from the event queue. The map manager (MM) 244 may handle or control map data. The state manager 246 may perform an operation such as garbage collection (GC) or wear leveling (WL), after checking an operation state of the memory device 150. The block manager 248 may execute commands or instructions onto a block in the memory device 150.

The host request manager (HRM) 242 may use the map manager (MM) 244 and the block manager 248 to handle or process requests according to read and program commands and events which are delivered from the host interface layer 220. The host request manager (HRM) 242 may send an inquiry request to the map manager (MM) 244 to determine a physical address corresponding to a logical address which is entered with the events. The host request manager (HRM) 242 may send a read request with the physical address to the memory interface layer 260 to process the read request, i.e., handle the events. In one embodiment, the host request manager (HRM) 242 may send a program request (or a write request) to the block manager 248 to program data to a specific empty page storing no data in the memory device 150, and then may transmit a map update request corresponding to the program request to the map manager (MM)

244 in order to update an item relevant to the programmed data in information of mapping the logical and physical addresses to each other.

The block manager 248 may convert a program request delivered from the host request manager (HRM) 242, the map manager (MM) 244, and/or the state manager 246 into a flash program request used for the memory device 150, to manage flash blocks in the memory device 150. To maximize or enhance program or write performance of the memory system 110, the block manager 248 may collect program requests and send flash program requests for multiple-plane and one-shot program operations to the memory interface layer 260. In an embodiment, the block manager 248 sends several flash program requests to the memory interface layer 260 to enhance or maximize parallel processing of a multi-channel and multi-directional flash controller.

In an embodiment, the block manager 248 may manage blocks in the memory device 150 according to the number of valid pages, select and erase blocks having no valid pages when a free block is needed and select a block including the least number of valid pages when it is determined that garbage collection is to be performed. The state manager 246 may perform garbage collection to move valid data stored in the selected block to an empty block and erase data stored in the selected block so that the memory device 150 may have enough free blocks (i.e., empty blocks with no data).

When the block manager 248 provides information regarding a block to be erased to the state manager 246, the state manager 246 may check all flash pages of the block to be erased to determine whether each page of the block is valid. For example, to determine validity of each page, the state manager 246 may identify a logical address recorded in an out-of-band (OOB) area of each page. To determine whether each page is valid, the state manager 246 may compare a physical address of the page with a physical address mapped to a logical address obtained from an inquiry request. The state manager 246 sends a program request to the block manager 248 for each valid page. A map table may be updated by the map manager 244 when a program operation is complete.

The map manager 244 may manage map data, e.g., a logical-physical map table. The map manager 244 may process various requests, for example, queries, updates, and the like, which are generated by the host request manager (HRM) 242 or the state manager 246. The map manager 244 may store the entire map table in the memory device 150, e.g., a flash/non-volatile memory, and cache mapping entries according to the storage capacity of the memory 144. When a map cache miss occurs while processing inquiry or update requests, the map manager 244 may send a read request to the memory interface layer 260 to load a relevant map table stored in the memory device 150. When the number of dirty cache blocks in the map manager 244 exceeds a certain threshold value, a program request may be sent to the block manager 246, so that a clean cache block is made and a dirty map table may be stored in the memory device 150.

When garbage collection is performed, the state manager 246 copies valid page(s) into a free block, and the host request manager (HRM) 242 may program the latest version of the data for the same logical address of the page and concurrently issue an update request. When the state manager 246 requests the map update in a state in which the copying of the valid page(s) is not completed normally, the map manager 244 may not perform the map table update. This is because the map request is issued with old physical information when the state manger 246 requests a map update and a valid page copy is completed later. The map manager 244 may perform a map update operation to ensure accuracy when, or only if, the latest map table still points to the old physical address.

The memory interface layer 260 may exchange data, commands, state information, and the like, with a plurality of memory chips 252 in the memory device 150 through a data communication method. According to an embodiment, the memory interface layer 260 may include a status check schedule manager 262 and a data path manager 264. The status check schedule manager 262 can check and determine the operation state regarding the plurality of memory chips 252 coupled to the controller 130, the operation state regarding a plurality of channels CH0, CH1, . . . , CHn and the plurality of ways W0, . . . , W_k, and the like. The transmission and reception of data or commands can be scheduled in response to the operation states regarding the plurality of memory chips 252 and the plurality of channels CH0, CH1, . . . , CHn. The data path manager 264 can control the transmission and reception of data, commands, etc. through the plurality of channels CH0, CH1, . . . , CHn and ways W0, . . . , W_k based on the information transmitted from the status check schedule manager 262. According to an embodiment, the data path manager 264 may include a plurality of transceivers, each transceiver corresponding to each of the plurality of channels CH0, CH1, . . . , CHn. Further, according to an embodiment, the status check schedule manager 262 and the data path manager 264 included in the memory interface layer 260 could be implemented as, or engaged with, the memory control sequence generator 332.

According to an embodiment, the memory interface layer 260 may further include error correction code (ECC) circuitry 266 configured to perform error checking and correction of data transferred between the controller 130 and the memory device 150. The ECC circuitry 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

For finding and correcting any error of data transferred from the memory device 150, the ECC circuitry 266 can include an error correction code (ECC) encoder and an ECC decoder. The ECC encoder may perform error correction encoding of data to be programmed in the memory device 150 to generate encoded data into which a parity bit is added and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and outputs an instruction signal, e.g., a correction success signal or a correction fail signal, based on a result of the error correction decoding. The ECC circuitry 266 may use a parity bit, which has been generated during the ECC encoding process for the data stored in the memory device 150, to correct the error bits of the read data entries. When the number of the error bits is greater than or equal to the number of correctable error bits, the ECC circuitry 266 may not correct the error bits and instead may output the correction fail signal indicating failure in correcting the error bits.

According to an embodiment, the ECC circuitry 266 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The ECC circuitry 266 may include all circuits, modules, systems, and/or devices for performing the error correction operation based on at least one of the above-described codes.

For example, the encoder in the ECC circuitry 266 may generate a codeword that is a unit of ECC-applied data. A codeword of length n bits may include k bits of user data and (n-k) bits of parity. A code rate may be calculated as (k/n). The higher the code rate, the more user data that can be stored in a given codeword. As the length of the codeword is longer and the code rate is smaller, the error correction capability of the ECC circuitry 266 could be improved. In addition, the ECC circuitry 266 performs decoding using information read from the channels CH0, CH1, . . . , CHn. The decoder in the ECC circuitry 266 can be classified into a hard decision decoder and a soft decision decoder according to how many bits represent the information to be decoded. A hard decision decoder performs decoding with a memory cell output information expressed in 1 bit, and the 1-bit information used at this time is called hard decision information. A soft decision decoder uses more accurate memory cell output information composed of 2 bits or more, and this information is called soft decision information. The ECC circuitry 266 may correct errors included in data using the hard decision information or the soft decision information.

According to an embodiment, to increase the error correction capability, the ECC circuitry 266 may use a concatenated code using two or more codes. In addition, the ECC circuitry 266 may use a product code that divides one codeword into several rows and columns and applies a different relatively short ECC to each row and column.

In accordance with an embodiment, a manager included in the host interface layer 220, the flash translation layer (FTL) 240, and the memory interface layer 260 could be implemented with a general processor, an accelerator, a dedicated processor, a co-processor, a multi-core processor, or the like. According to an embodiment, the manager can be implemented with firmware working with a processor.

According to an embodiment, the memory device 150 is embodied as a non-volatile memory such as a flash memory, for example, a Read Only Memory (ROM), a Mask ROM (MROM), a Programmable ROM (PROM), an Erasable ROM (EPROM), an Electrically Erasable ROM (EEPROM), a Magnetic Random Access Memory (MRAM), a NAND flash memory, a NOR flash memory, or the like. In another embodiment, the memory device 150 may be implemented by at least one of a phase change random access memory (PCRAM), a Resistive Random Access Memory (ReRAM), a ferroelectrics random access memory (FRAM), a spin transfer torque random access memory (STT-RAM), and a spin transfer torque magnetic random access memory (STT-MRAM), or the like.

Figure 13:
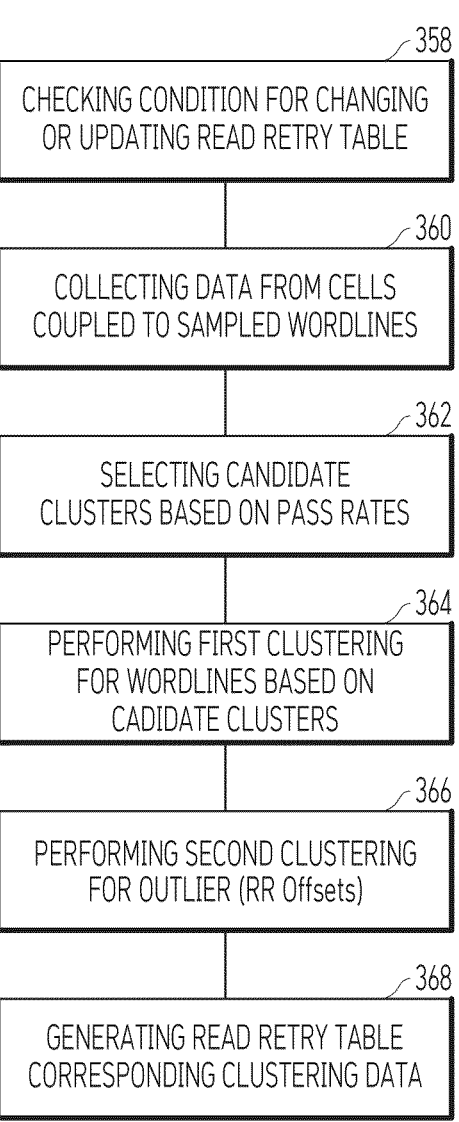
FIG. 13 illustrates a second method for generating a read retry table according to an embodiment of the present disclosure.

FIG. 13 illustrates a second method for generating a read retry table according to an embodiment of the present disclosure.

An operating state of a non-volatile memory cell included in the memory devices 950, 150 described in FIGS. 1 and 12 may be changed, so that safety and reliability of data obtained through a read operation using a previously generated or updated RRT might not be guaranteed. In this case, a controller may determine that the non-volatile memory cell may not be used any more. However, if the RRT could be updated based on a current operating state of the non-volatile memory cell, the non-volatile memory cell may be continuously used. That is, a lifespan of the memory devices 950, 150 could be increased when the RRT is updated.

Referring to FIG. 13, the second method for generating the RRT can include checking a condition for generating or updating the RRT (operation 358), collecting data from memory cells coupled to a selected word line (operation 360), selecting a cluster candidate based on a pass rate (operation 362), clustering word lines based on collected data (operation 364), clustering outliers (operation 366), and generating or updating the RRT based on clustered data (operation 368). Here, the operation 364 of clustering the word lines based on the collected data can be understood as the first clustering, and the operation 366 of clustering outliers could be understood as the second clustering. For convenience of description, the second method described in FIG. 13 will be described based on a difference between the first method described in FIG. 4 and the second method.

In the case of the memory system 110 described in FIG. 12, wear of the memory device 150 occurs through data input/output operations. It might be necessary to generate or update the RRT stored in the memory system 110 in response to the wear of the memory device 150 because operational characteristics could be varied due to the wear of the memory device 150. According to an embodiment, the condition for generating or updating the RRT may vary. For example, when a preset number of Uncorrectable Error Correction Code (UECC) errors occur in the memory device 150, the memory system 110 may determine that the RRT needs to be generated or updated. As another example, when program/erase cycles (P/E cycles) in the memory device 150 exceed a predetermined criterion, the memory system 110 may determine that the RRT needs to be generated or updated.

When the memory system 110 determines that the RRT needs to be generated or updated, the memory system 110 may request the host 102 or the memory test device 900, which may be connected through a bus or a network, to generate or update the RRT stored in the memory system 110. The RRT generating/updating device 910 included in the host 102 or the memory testing device 900 may transfer information about sampled word lines to the memory system 110. The memory system 110 may transfer data collected from memory cells coupled to the sampled word lines to the RRT generating/updating device 910.

The RRT generating/updating device 910 can perform the first clustering 344, 364 and the second clustering 346, 366, described in FIGS. 4 and 13, and generate or update the RRT based on values or results obtained from the first clustering 344, 364 and the second clustering 346, 366. The RRT generating/updating device 910 can transfer the values or results to the memory system 110. The memory system 110 may generate or update the RRT based on the values or results transferred from the RRT generating/updating device 910.

According to an embodiment, the RRT in the memory system 110 is generated or updated through the RRT generating/updating device 910 included in the host 102 or the memory test device 900. This procedure may be performed when the memory system 110 is in an idle state, thereby avoiding deterioration of I/O throughput.

As above described, input/output performance of a memory system could be improved by reducing consumed resources used for a machine learning algorithm to provide a broad or targeted coverage of a RRT corresponding to an error correction capability of error correction circuitry or an error correction code (ECC) module according to an embodiment of the present disclosure.

Further, a memory device or a memory system according to an embodiment of the present disclosure can reduce an uncorrectable error correction code (UECC) error based on an improved RRT, thereby reducing defects and avoiding decrease of lifespan in the memory device or the memory system.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A read retry table generator coupled to a plurality of memory dies via a data path, wherein the read retry table generator is configured to:

collect data from a plurality of memory cells coupled to a plurality of word lines in the plurality of memory dies;

determine a pass rate of collected data appertaining to a plurality of clusters;

select a cluster candidate among the plurality of clusters, based on the pass rate of collected data; and cluster the collected data into the cluster candidate to generate a read retry table, wherein the read retry table generator is configured to cluster the collected data into the cluster candidate by:

performing a first clustering on the plurality of word lines based on an error correction capability of error correction circuitry for the collected data;

performing a second clustering on an outlier of the first clustering; and generating or updating the read retry table based on values obtained from the first clustering and the second clustering.

2. The read retry table generator according to claim 1, wherein the plurality of memory dies is arranged in a same row or a same column of a same wafer.

3. The read retry table generator according to claim 2, wherein the plurality of word lines corresponds to at least one same row address sampled from a memory block or a word line group included in each of the plurality of memory dies.

4. The read retry table generator according to claim 1, wherein the read retry table generator is coupled to the plurality of memory dies via a same channel of the data path.

5. The read retry table generator according to claim 1, comprising:

a cluster candidate selector configured to, for at least one cluster on the plurality of word lines, increase the pass rate of the at least one cluster if a fail bit count is within the error correction capability of the error correction circuitry, and sequentially select the cluster candidate starting from the highest pass rate among the pass rates for each cluster; and a first read retry table generator configured to generate a first read retry table by performing the first clustering for the cluster candidate and the second clustering for the outlier.

6. The read retry table generator according to claim 5, wherein the first clustering comprises:

searching a centroid corresponding to the cluster candidate;

adding a word line belong to a Voronoi distance range from the centroid into the cluster candidate, the Voronoi distance range corresponding to the error correction capability of the error correction circuitry; and classifying a word line which does not belong to the cluster candidate as the outlier of the first clustering.

7. The read retry table generator according to claim 5, wherein the read retry table generator is configured to calculate the fail bit count for each of the plurality of word lines based on preset levels of a read voltage, the preset levels corresponding to selected values among multi-bit data stored in the plurality of memory cells.

8. The read retry table generator according to claim 1, wherein the second clustering comprises:

adding the outlier of the first clustering to an additional cluster having a Voronoi distance range calculated based on the error correction capability of the error correction circuitry and a fail bit count which is obtained by applying values stored or predetermined in the read retry table before the read retry table generator generates or updates the read retry table; and calculating values for the read retry table to add all of the outlier of the first clustering to the additional cluster.

9. The read retry table generator according to claim 1, further comprising:

a second read retry table generator configured to generate a second read retry table based on information regarding the cluster candidate, through the first clustering and another clustering distinct from the second clustering; and a comparator configured to compare the first read retry table with the second read retry table and select one of the first read retry table and the second read retry table based on a comparison result.

10. The read retry table generator according to claim 9, wherein the comparator compares ranges of the first read retry table and the second read retry table and selects the one with a wider range.

11. The read retry table generator according to claim 9, wherein the comparator compares a number of tables belonging to each of the first read retry table and the second read retry table and selects the one with a smaller number of tables.

12. A method for operating a data processing apparatus, the method comprising:

collecting data from a plurality of memory cells coupled to a plurality of word lines in a plurality of memory dies via a data path;

determining a pass rate of collected data appertaining to a plurality of clusters;

selecting a cluster candidate among the plurality of clusters, based on the pass rate of collected data;

performing a first clustering on the plurality of word lines based on the cluster candidate and an error correction capability of error correction circuitry for the collected data;

performing a second clustering on an outlier of the first clustering; and generating or updating a first read retry table based on values obtained from the first clustering and the second clustering.

13. The method according to claim 12, wherein the generating or updating the first read retry table comprises:

receiving the values obtained from the first clustering and the second clustering via a network;

generating or updating the first read retry table based on the values; and storing the first read retry table in a non-volatile memory storage.

14. The method according to claim 12, wherein the selecting the cluster candidate comprises:

setting a plurality of clusters for the plurality of word lines and calculating a pass rate for each of the plurality of clusters; and sequentially selecting the cluster candidate starting from the cluster corresponding to the highest pass rate among pass rates for the plurality of clusters.

15. The method according to claim 14, wherein the calculating the pass rate comprises:

increasing a pass rate of a first cluster when a fail bit count of a first word line is within the error correction capability of the error correction circuitry if applying the first word line among the plurality of word lines to the first cluster among the plurality of clusters; and decreasing the pass rate of the first cluster when the fail bit count of the first word line exceeds the error correction capability of the error correction circuitry.

16. The method according to claim 12, wherein the performing the first clustering comprises:

searching a centroid corresponding to the cluster candidate;

adding a word line belong to a Voronoi distance range from the centroid into the cluster candidate, the Voronoi distance range corresponding to the error correction capability of the error correction circuitry; and classifying a word line which does not belong to the cluster candidate as the outlier of the first clustering.

17. The method according to claim 12, wherein the performing the second clustering comprises:

adding the outlier of the first clustering to an additional cluster having a Voronoi distance range calculated based on the error correction capability of the error correction circuitry and a fail bit count which is obtained by applying values stored or predetermined in the read retry table before the generating or updating the first read retry table; and calculating the values for the first read retry table to add all of the outlier of the first clustering to the additional cluster.

18. The method according to claim 12, further comprising:

generating a second read retry table based on information regarding the cluster candidate, through the first clustering and another clustering distinct from the second clustering; and selecting one of the first read retry table and the second read retry table.

19. The method according to claim 18, wherein the selecting the one of the first read retry table and the second read retry table comprises:

comparing a number of tables belonging to each of the first read retry table and the second read retry table or ranges of the first read retry table and the second read retry table; and selecting the one with a smaller number of tables or the one with a wider range.

* * * * *